United States Patent
Sio et al.

(10) Patent No.: US 11,515,308 B2
(45) Date of Patent: Nov. 29, 2022

(54) INTEGRATED CIRCUIT STRUCTURE WITH HYBRID CELL DESIGN

(71) Applicant: TAIWAN SEMICONDUCTOR MANUFACTURING CO., LTD., Hsinchu (TW)

(72) Inventors: Kam-Tou Sio, Hsinchu County (TW); Jiann-Tyng Tzeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 180 days.

(21) Appl. No.: 16/900,768

(22) Filed: Jun. 12, 2020

(65) Prior Publication Data
US 2021/0391328 A1    Dec. 16, 2021

(51) Int. Cl.
*H01L 27/092* (2006.01)
*G06F 30/392* (2020.01)

(52) U.S. Cl.
CPC ........ *H01L 27/0924* (2013.01); *G06F 30/392* (2020.01)

(58) Field of Classification Search
CPC ......... H01L 27/0924; H01L 21/823821; H01L 21/823807; H01L 27/0928; H01L 27/0207; G06F 30/392
See application file for complete search history.

(56) References Cited

U.S. PATENT DOCUMENTS

| 10,878,158 | B2 | 12/2020 | Lin et al. | |
|---|---|---|---|---|
| 2015/0357411 | A1 | 12/2015 | Cheng et al. | |
| 2018/0366589 | A1 | 12/2018 | Shimbo | |
| 2019/0164949 | A1 | 5/2019 | Sio et al. | |
| 2020/0105616 | A1* | 4/2020 | Liaw | ................... H01L 29/6681 |
| 2020/0134122 | A1* | 4/2020 | Huang | ............... G06F 30/3312 |
| 2021/0143800 | A1* | 5/2021 | Lee | ..................... H01L 27/0924 |

FOREIGN PATENT DOCUMENTS

| DE | 102018129324 A1 | 5/2019 |
|---|---|---|
| KR | 20190062312 A | 6/2019 |
| KR | 20200008526 A | 1/2020 |

* cited by examiner

*Primary Examiner* — Nelson Garces
(74) *Attorney, Agent, or Firm* — Maschoff Brennan

(57) ABSTRACT

An IC structure includes first and second cell rows extending in a first direction. The first cell row includes first cells each including one or more first fins having first source/drain regions of a first conductivity type and one or more second fins having second source/drain regions of a second conductivity type opposite the first conductivity type. The second cell row includes second cells each including one or more third fins having third source/drain regions of the first conductivity type and one or more fourth fins having fourth source/drain regions of the second conductivity type. The first cells have a same first number of the one or more first fins, and the second cells have a same second number of the one or more third fins less than the first number of the one or more first fins.

20 Claims, 24 Drawing Sheets

INTEGRATED CIRCUIT STRUCTURE WITH HYBRID CELL DESIGN

BACKGROUND

Scaling of semiconductor devices follows Moore's Law in the past few decades. As advances in manufacturing processes are independently unable to keep up with the constant device scaling trend due to lithography and integration limitations, layout design techniques also help to further scaling of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
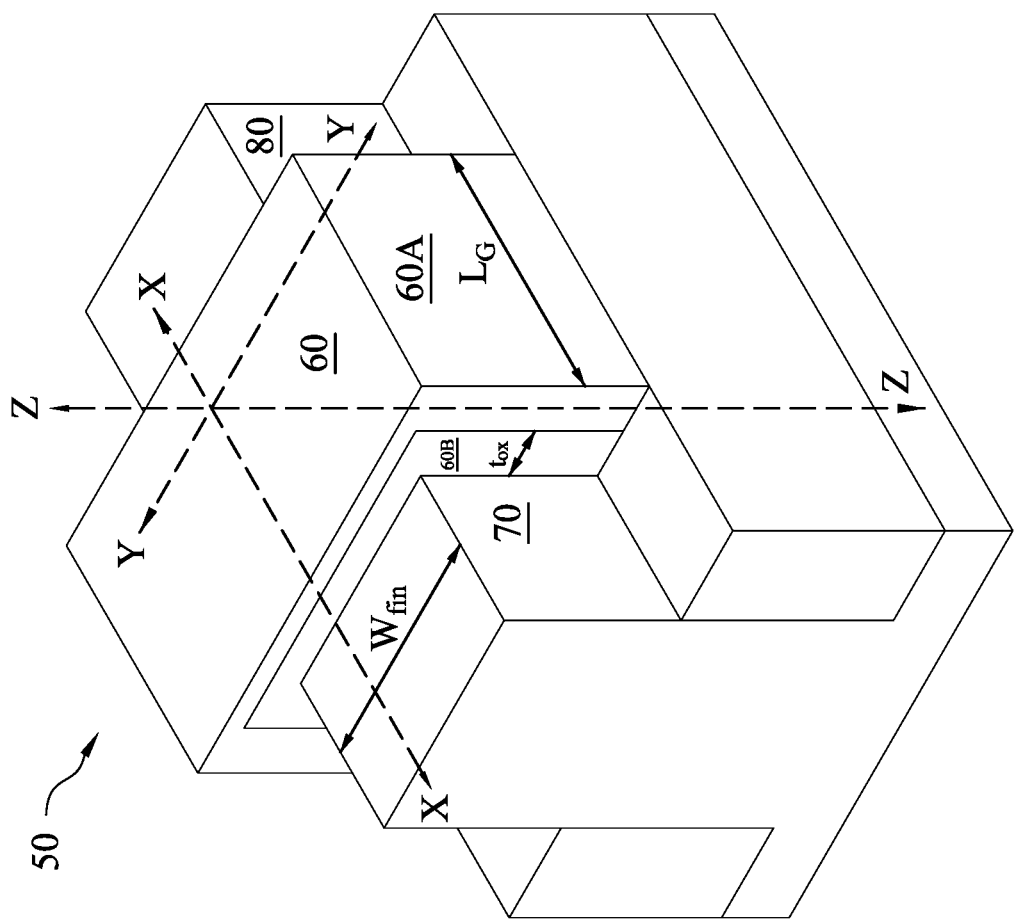
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to, but not otherwise limited to, fin-like field-effect transistor (FinFET) devices. The FinFET devices, for example, may be complementary metal-oxide-semiconductor (CMOS) devices including P-type metal-oxide-semiconductor (PMOS) FinFET devices and N-type metal-oxide-semiconductor (NMOS) FinFET devices. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode 60A and a gate dielectric layer 60B. The gate dielectric layer 60B has a thickness $t_{ox}$ measured in the Y-direction. A portion of the gate 60 is located over a dielectric isolation structure such as shallow trench isolation (STI). A source region 70 and a drain region 80 of the FinFET device 50 are formed in extensions of the fin on opposite sides of the gate 60. A portion of the fin being wrapped around by the gate 60 serves as a channel region of the FinFET device 50. The effective channel length of the FinFET device 50 is determined by the dimensions of the fin.

Figure 2:
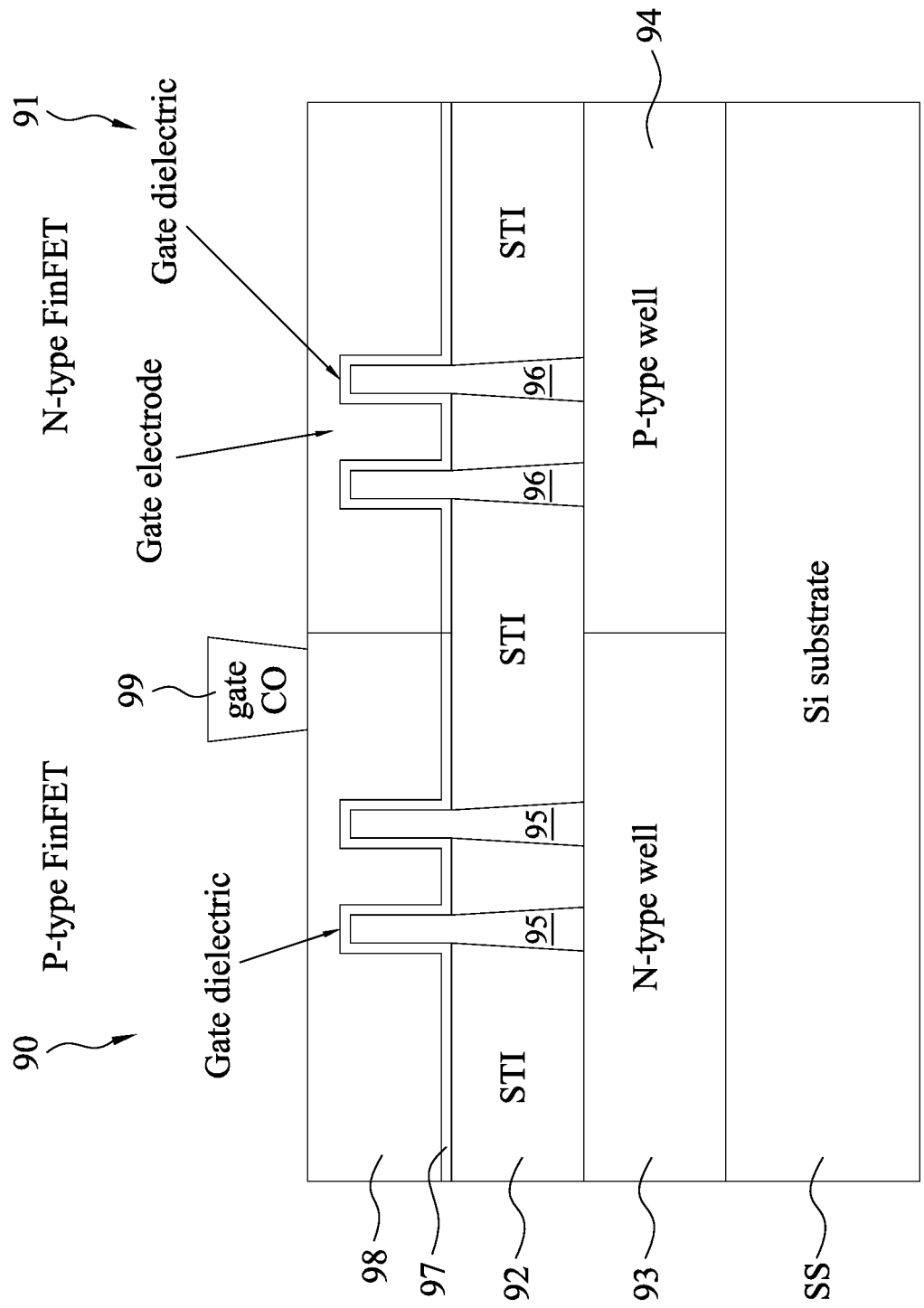
FIG. 2 illustrates a cross-sectional view of FinFET transistors in a CMOS configuration.

FIG. 2 illustrates a diagrammatic cross-sectional side view of FinFET transistors in a CMOS configuration. The CMOS FinFET includes a substrate SS, for example a silicon substrate. An N-type well 93 and a P-type well 94 are formed in the substrate SS. A dielectric isolation structure 92 such as a shallow trench isolation (STI) is formed over the N-type well 93 and the P-type well 94. A P-type FinFET 90 is formed over the N-type well 93, and an N-type FinFET 91 is formed over the P-type well 94. The P-type FinFET 90 includes PFET fins 95 that protrude upwardly out of the STI 92, and the N-type FinFET 91 includes NFET fins 96 that protrude upwardly out of the STI 92. The PFET fins 95 include the channel regions of the P-type FinFET 90, and the NFET fins 96 include the channel regions of the N-type FinFET 91. In some embodiments, the PFET fins 95 are comprised of silicon germanium (SiGe) for strain and/or stress enhancement, and the NFET fins 96 are comprised of silicon. A gate dielectric 97 is formed over the fins 95-96 and over the STI 92, and a gate electrode 98 is formed over the gate dielectric 97. In some embodiments, the gate dielectric 97 includes a high-k dielectric material, and the gate electrode 98 includes a metal gate electrode, such as tungsten and/or other refractory metals. In some other embodiments, the gate dielectric 97 may include SiON, and the gate electrode 98 may include polysilicon. A gate contact 99 is formed on the gate electrode 98 to provide electrical connectivity to the gate.

FinFET devices offer several advantages over planar Metal-Oxide Semiconductor Field Effect Transistor (MOSFET) devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

IC designs are based on a collection of cells selected from a cell library. The layout includes at least one logic block customized for a particular use. A logic block is an arrangement of cells placed in a routing grid of vertical and horizontal routing tracks. Conductive structures, such as metal lines, are routed on routing tracks to provide connection between cells. The design of an IC layout can be carried out by an automatic placement and routing (APR) tool that includes a placer and a router, by selecting standard cells from a library of standard cells and placing and routing the cells according to a number of design rules. The placer determines the optimum location of each standard cell of the integrated circuit, and the router optimizes the routing of input/output lines and the connection between standard cells so that the IC layout does not become overly congested by input/output and other routing lines.

Cells with fewer fins are used for realizing high integration and low power consumption, while cells with a more fins are used for high speed operation (i.e. high performance operation). With the increasing demands for higher speed and lower power integrated circuits which are applicable for certain application (e.g., server chips, mobile chips and so on), logic blocks are modified to include both cells with fewer fins and cells with more fins. Such hybrid cell design often results in a placed-and-routed layout having discontinuous PFET fins. To fabricate an IC structure having such a layout, a fin breaking process (interchangeably referred to as fin cut process) is performed to break a continuous PFET fin into multiple discontinuous PFET fins. However, the fin breaking process would lead to stress relaxation in the PFET fins formed of SiGe, which in turn would result in hole mobility reduction in the PFET fins, thus degrading the ON-current of P-type FinFETs.

In some embodiments, a layout design methodology for placing both cells with fewer fins and cells with more fins is provided. The layout design methodology designs an odd-row cell library storing odd-row cells that share a same PFET fin number and an even-row cell library storing even-row cells that share a same PFET fin number. The PFET fin number of the odd-row cells is different from the PFET fin number of the even-row cells. Moreover, the odd-row cells are different from each other at least in NFET fin numbers. Similarly, the even-row cells are different from each other at least in NFET fin numbers. By using such layout design methodology, high speed cells (interchangeably referred to as speed-oriented cells) and lower power cells (interchangeably referred to as power-oriented cells) can be generated in a layout without generating discontinuous PFET fins in the layout.

For example, in some embodiments where the PFET fin number of odd-row cells is greater than that of even-row cells, speed-oriented cells (i.e. having more fins) can be formed by placing odd-row cells side-by-side along an odd row, and power-oriented cells (i.e., having fewer fins) can be formed by placing even-row cells side-by-side along an even row, without generating discontinuous PFET fins in either the odd row or the even row. On the other hand, in some embodiments where the PFET fin number of even-row cells is greater than that of odd-row cells, speed-oriented cells can be formed by placing even-row cells side-by-side along even row, and power-oriented cells can be formed by placing odd-row cells along an odd row, without generating discontinuous PFET fins in either the odd row or the even row.

Figure 3:
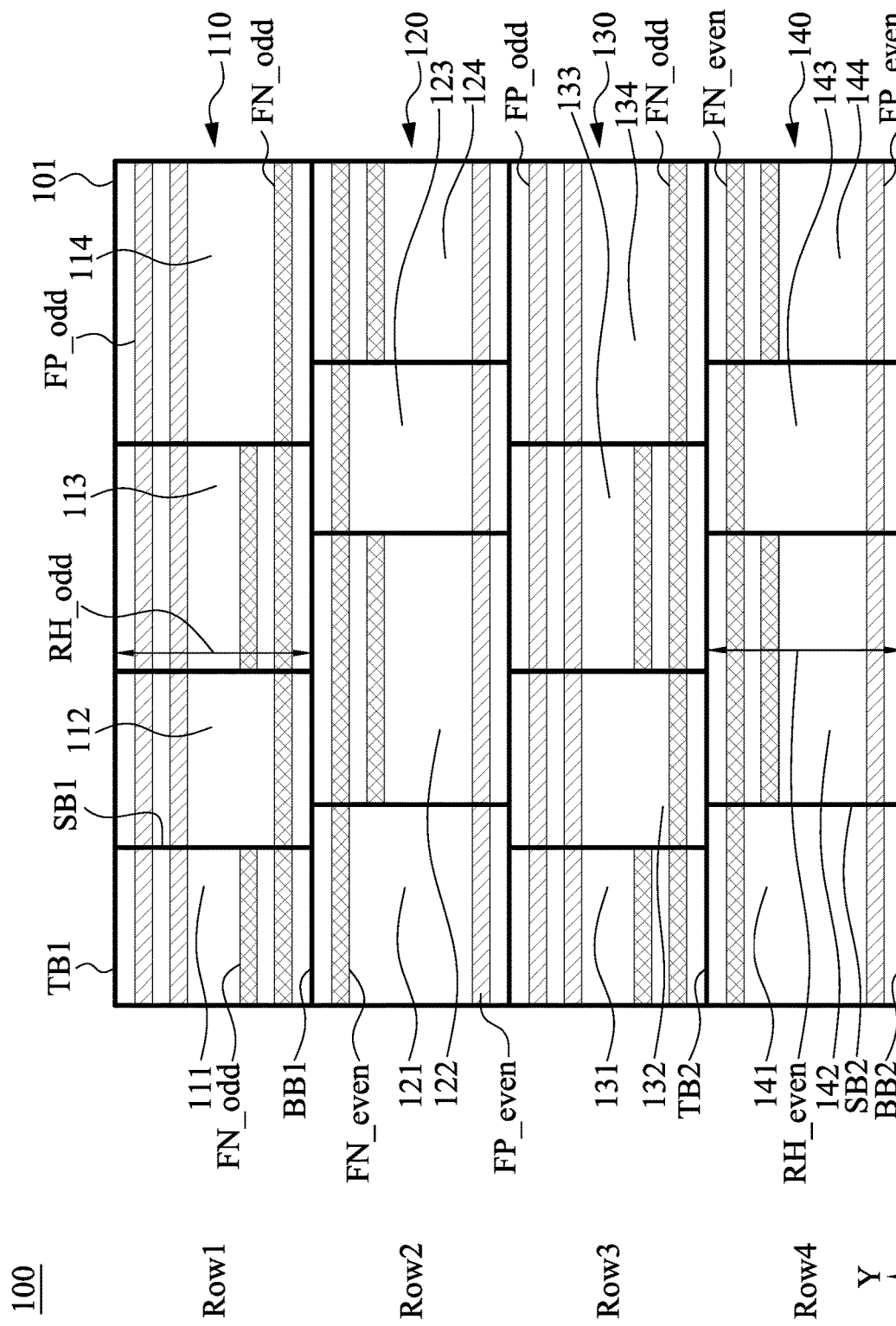
FIG. 3 illustrates a top view of a fin layout of some cells of an exemplary integrated circuit designed by systems and methods of the present disclosure, in accordance with some embodiments.

FIG. 3 illustrates a top view of a fin layout of some cells of an exemplary integrated circuit 100 designed by systems and methods of the present disclosure, in accordance with some embodiments. Not all of the illustrated components are required, however, and some embodiments of the present disclosure may include additional components not shown in FIG. 3. Variations in the arrangement and type of the components may be made without departing from the scope of the present disclosure as set forth herein. Additional, different or fewer components may be included.

As illustrated in FIG. 3, the integrated circuit 100 includes cell groups 110, 120, 130 and 140 arranged (i.e., laid out) in respective "cell rows" or "rows" with respect to a grid 101. Further, in some embodiments, each cell group includes one or more cells disposed side-by-side along the respective row. For example, the cell group 110 include cells 111, 112, 113, and 114 that are arranged in the first row (Row1) of the grid 101; the cell group 120 includes cells 121, 122, 123 and 124 that are arranged in the second row (Row2) of the grid 101; the cell group 130 includes cells 131, 132, 133 and 134 that are arranged in the third row (Row3) of the grid 101; the cell group 140 includes cells 141, 142, 143 and 144 that are arranged in the fourth row (Row4) of the grid 101. In some embodiments, the integrated circuit 100 includes a number of rows other than four. Each row in the plurality of rows Row1-Row4 extends along the X-direction. In some embodiments, the X-direction is a horizontal direction of the top view of the integrated circuit 100. In some embodiments, the X-direction is a direction other than horizontal. Rows in the plurality of rows Row1-Row4 are abutted to one another in the Y-direction that is perpendicular to the X-direction. In some embodiments, the Y-direction is a vertical direction of the top view of the integrated circuit 100. In some embodiments, the Y-direction is a direction other than vertical.

The cells of the cell groups 110, 120, 130 and 140 are retrieved from respective standard cell libraries having different PFET fin numbers. By way of example and not limitation, the cells of the cell groups 110 and 130 are retrieved from an odd-row cell library including a plurality of odd-row cells, each of which share a first PFET fin number; and the cells of the cell groups 120 and 140 are retrieved from an even-row cell library including a plurality of even-row cells, each of which share a second PFET fin number. Alternatively stated, the cells 111-114 are a subset of the odd-row cell library, cells 131-134 are another subset of the odd-row cell library, the cells 121-124 are a subset of the even-row cell library, and the cells 141-144 are another subset of the even-row cell library. Because the cells 111-114 and 131-134 retrieved from the odd-row cell library share a same first PFET fin number (e.g., two PFET fins FP_odd in the example integrated circuit 100), and the cells 121-124 and 141-144 retrieved from the even-row cell library share a same second PFET fin number (e.g., one PFET fin FP_even in the example integrated circuit 100), the integrated circuit 100 includes no discontinuous PFET fins. Each of the cells 111-114, 131-134 in the odd-row cell library and the cells 121-124, 141-144 in the even-row cell library is associated with a specific logic function and/or characteristic (e.g., a timing characteristic). Accordingly, it is noted that although the cells 111-114 and 131-134 are retrieved from the odd-row cell library, not all of them share a same cell width (e.g., the width measured in X-direction). Similarly, although the cells 121-124 and 141-144 are retrieved from the even-row cell library, not all of them share a same cell width.

In some embodiments, along the Row1 of grid 101, the cells 111-114 respectively include two PFET fins FP_odd continuously extending along the X-direction across the cells 111-114; along the Row2 of grid 101, the cells 121-124 respectively include one PFET fin FP_even continuously extending along the X-direction across the cells 121-124; along the Row3 of grid 101, the cells 131-134 respectively include two PFET fin FP_odd continuously extending along the X-direction across the cells 131-134; along the Row4 of grid 101, the cells 141-144 respectively include one PFET fin FP_even continuously extending along the X-direction across the cells 141-144. In such a configuration, cells in a same odd row (e.g., Row1 or Row3) share a same PFET fin number (e.g., two PFET fins FP_odd), and cells in in a same even row (e.g., Row2 or Row4) share a same PFET fin number (e.g., one PFET fin FP_even). As a result, all of the PFET fins FP_odd and FP_even are free from a fin cut process, so that the stress relaxation in the PFET fins FP_odd and FP_even resulting from the fin cut process can be prevented.

Moreover, along the Row1 of the grid 101, the cell 111 includes two NFET fins FN_odd, the cell 112 includes one NFET fin FN_odd, the cell 113 includes two NFET FN_odd and the cell 114 includes one NFET fin FN_odd. Similarly, along the Row3 of the grid 101, the cell 131 includes two NFET fins FN_odd, the cell 132 includes one NFET fin FN_odd, the cell 133 includes two NFET FN_odd and the cell 134 includes one NFET fin FN_odd. Stated differently, adjacent two of the cells 111-114 in Row1 and the cells 131-134 in Row3 are different at least in the NFET fin number. As a result, the NFET fins of cells in the Row1 and Row3 can be fabricated using a fin cut process to break a single continuous NFET fin into a plurality of discontinuous NFET fins FN_odd. Because NFET fins (e.g., germanium-free silicon fins) suffer less stress relaxation caused by fin cut process as compared to the PFET fins (e.g., silicon germanium fin), the fin cut process for fabricating the discontinuous NFET fins FN_odd will result in no or negligible impact on ON-currents of the NFETs of the cells in the Row1 and Row3.

Along the Row2 of the grid 101, the cell 121 includes one NFET fin FN_even, the cell 122 includes two NFET fins FN_even, the cell 123 includes one NFET FN_even and the cell 124 includes two NFET fin FN_even. Similarly, along the Row4 of the grid 101, the cell 141 includes one NFET fin FN_even, the cell 142 includes two NFET fins FN_even, the cell 143 includes one NFET FN_even and the cell 144 includes two NFET fin FN_even. Stated differently, adjacent two of the cells 121-124 in Row2 and the cells 141-144 in Row 4 are different at least in the NFET fin number. As a result, the NFET fins of cells in the Row2 and Row4 can be fabricated using a fin cut process to break a single continuous NFET fin into a plurality of discontinuous NFET fins NFET fin FN_even. Because NFET fins (e.g., germanium-free silicon fins) suffer less stress relaxation caused by fin cut process as compared to the PFET fins (e.g., silicon germanium fin), the fin cut process for fabricating the discontinuous NFET fins FN_even will result in no or negligible impact on ON-currents of the NFETs of the cells in the Row2 and Row4.

The cells 111, 113 in Row1 and the cells 131, 133 in Row3 have two PFET fins and two NFET fins, and thus these cells can be identified as 2P2N cells in the odd-row cell library. The cells 112, 114 in Row1 and the cells 132, 134 in Row3 have two PFET fins and one NFET fin, and thus these cells can be identified as 2P1N cells in the odd-row cell library. The cells 121, 123 in Row2 and the cells 141, 143 in Row4 have one PFET fin and one NFET fin, and thus these cells can be identified as 1P1N cells in the even-row cell library. The cells 122, 124 in Row2 and the cells 142, 144 in Row4 have one PFET fin and two NFET fins, and thus these cells can be identified as 1P2N cells in the even-row cell library. As a result, the odd-row cell library includes at least 2P2N cells and 2P1N cells, and the even-row cell library includes at least 1P2N cells and 1P1N cells. A maximal fin number of cells in the odd-row cell library (e.g., four fins) is thus greater than a maximal fin number of cells in the even-row cell library (e.g., three fins). Therefore, the odd-row cells can operate at a higher speed, and are thus applicable for high speed applications. The even-row cells can operate with less power, and are thus usable for low power applications. However, in some other embodiments, a maximal fin number of cells in the odd-row cell library can be less than a maximal fin number of cells in the even-row cell library, and thus the odd-row cells are usable for low power applications and the even-row cells are applicable for high speed applications.

In some embodiments, the integrated circuit 100 including 2P2N cells, 2P1N cells, 1P2N cells and 1P1N cells is applicable for mobile chips. However, the PFET fin number and NFET fin number of cells in the odd-row cell library and even-row cell library as discussed above are not intended to limit embodiments of the present disclosure, and the odd-row cell library and even-row cell library can include cells other than the foregoing cells. For example, in some other embodiments, the odd-row cell library include 3P3N cells (i.e., cells with three PFET fins and three NFET fins) and 3P2N cells (i.e., cells with three PFET fins and two NFET fins), and the even-row cell library includes 2P3N cells (i.e., cells with two PFET fins and three NFET fins) and 2P2N cells (cells with two PFET fins and two NFET fins). An integrated circuit including 3P3N cells, 3P2N cells, 2P3N cells and 2N2N cells is applicable for, e.g., server chips, which have a stricter speed demand than that of mobile chips.

In some embodiments, cells in the odd-row cell library and cells in the even-row cell library are standard cells. The standard cells include, but are not limited to, an INV, AND, OR, NAND, NOR, XOR, AOI, OAI, MUX, BUFF, adder, filler, flip-flop, latch, delay, clock cell, or the like. Alternatively, these cells are custom cells.

Each of the odd-row cells 111-114 and 131-134 has a substantially rectangular shape which includes a top boundary TB1, a bottom boundary BB1, and opposite side boundaries SB1. Top boundary TB1 and bottom boundary BB1 are parallel with the X-direction. Side boundaries SB1 are parallel with the Y-direction. The odd-row cells 111-114 and 131-134 share a same cell height CH_odd, which is defined between the top boundary TB1 and the bottom boundary BB1. As such, the odd rows Row1 and Row3 have a row height RH_odd equal to the cell height CH_odd. Likewise, each of the even-row cells 121-124 and 141-144 has a substantially rectangular shape which includes a top boundary TB2, a bottom boundary BB2, and opposite side boundaries SB2. Top boundary TB2 and bottom boundary BB2 are parallel with the X-direction. Side boundaries SB2 are parallel with the Y-direction. The even-row cells 121-124 and 141-144 share a same cell height CH_even, which is defined between the top boundary TB2 and the bottom boundary BB2. As such, the even rows Row2 and Row4 have a row height RH_even equal to the cell height CH_even. In some embodiments, the even-row height RH_even is equal to the odd-row height RH_odd. In some embodiments, the even-row height RH_even is less than the odd-row height RH_odd.

As the cells 111-114 in Row1 abut cells 121-124 in Row2, top boundaries TB2 of the cells 121-124 are merged with bottom boundaries BB1 of the cells 111-114. Likewise, top boundaries TB1 of the cells 131-134 in Row3 are merged with bottom boundaries BB2 of the cells 121-124 in Row2, and top boundaries TB2 of the cells 141-144 are merged with bottom boundaries BB1 of the cells 131-134 in Row3.

Figure 4A:
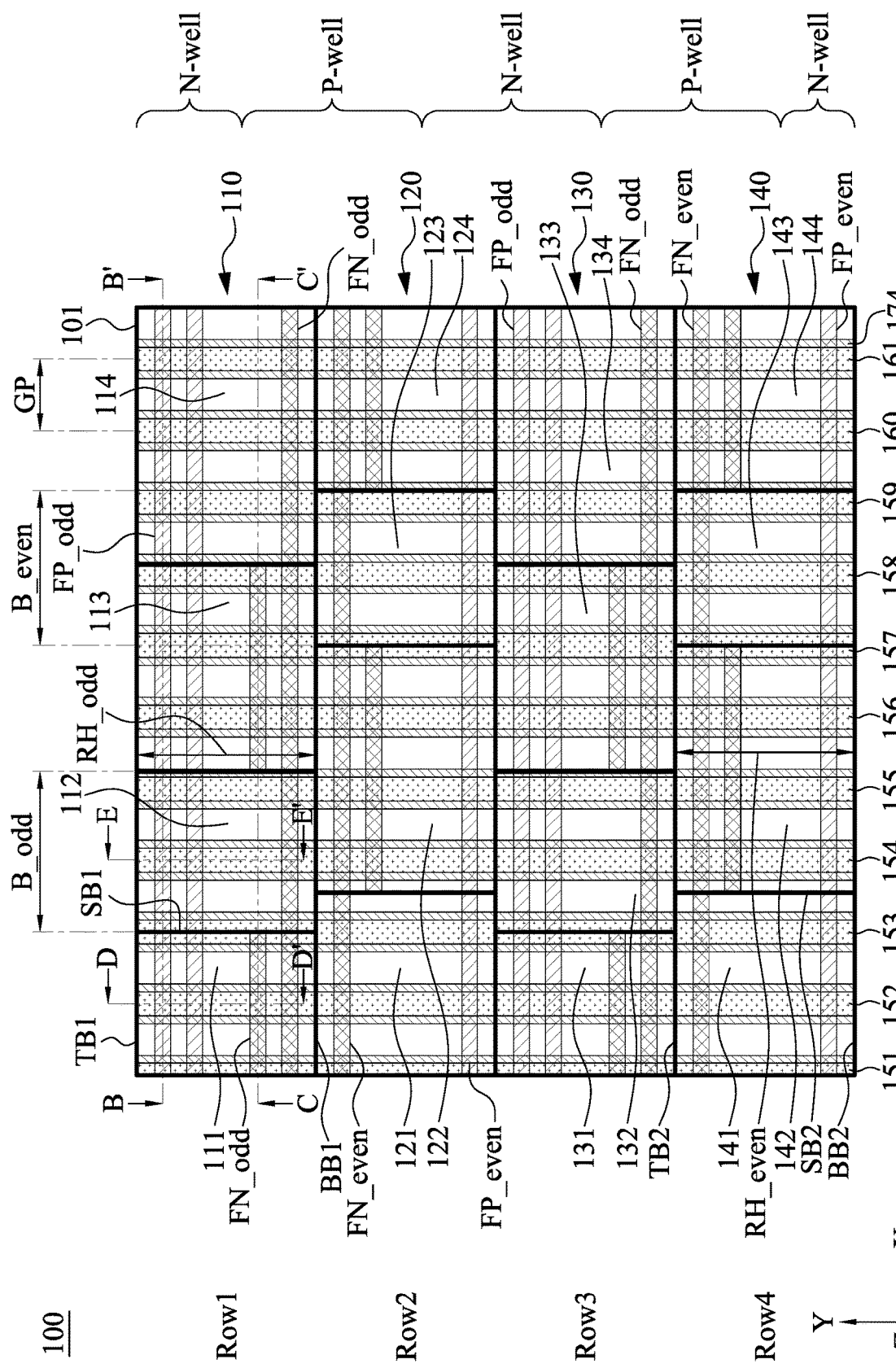
FIG. 4A illustrates a top view of an exemplary integrated circuit having the fin layout of FIG. 3 in accordance with some embodiments.
Figure 4B:
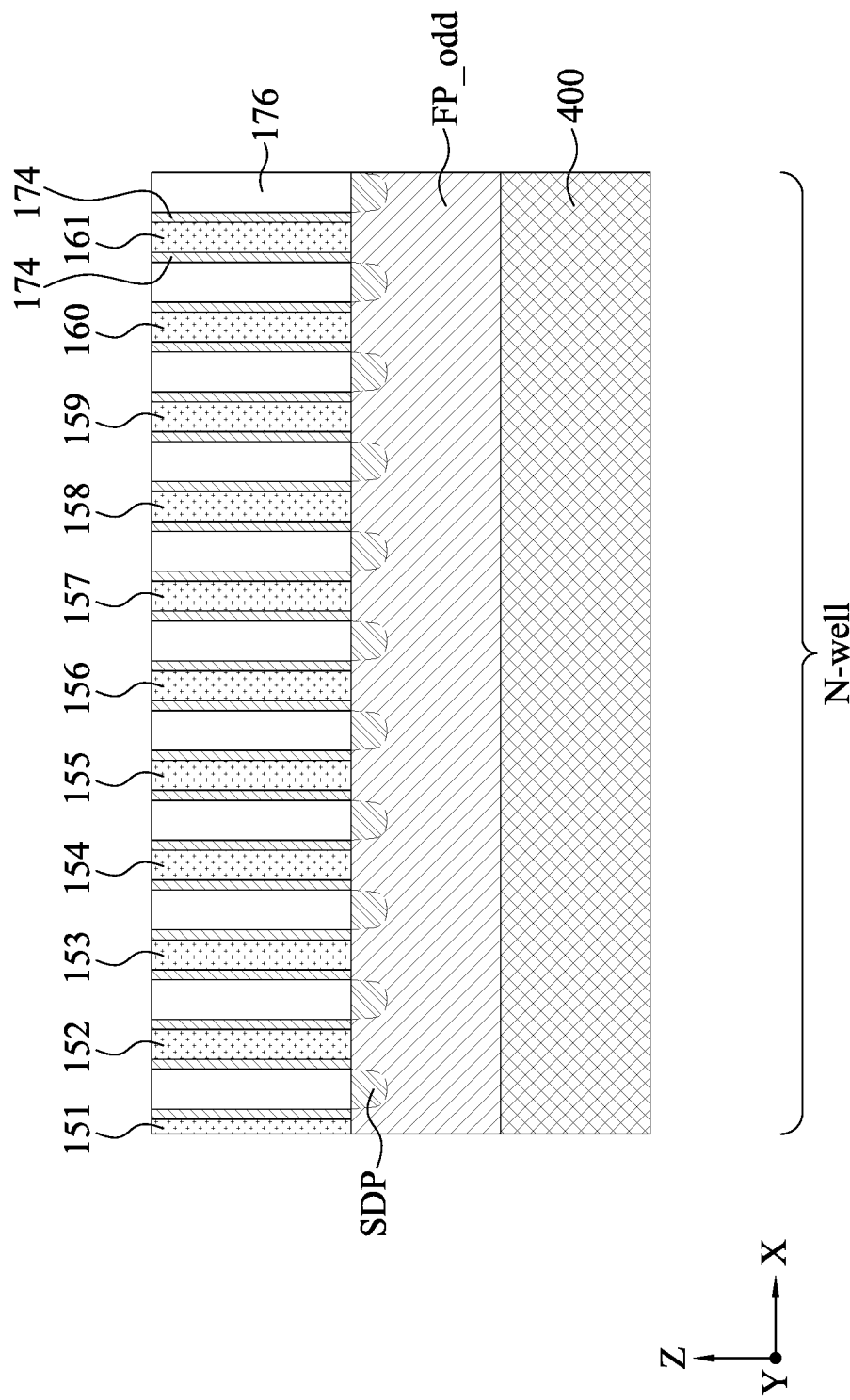
FIG. 4B is a cross-sectional view of the integrated circuit taken along B-B' line in FIG. 4A.
Figure 4C:
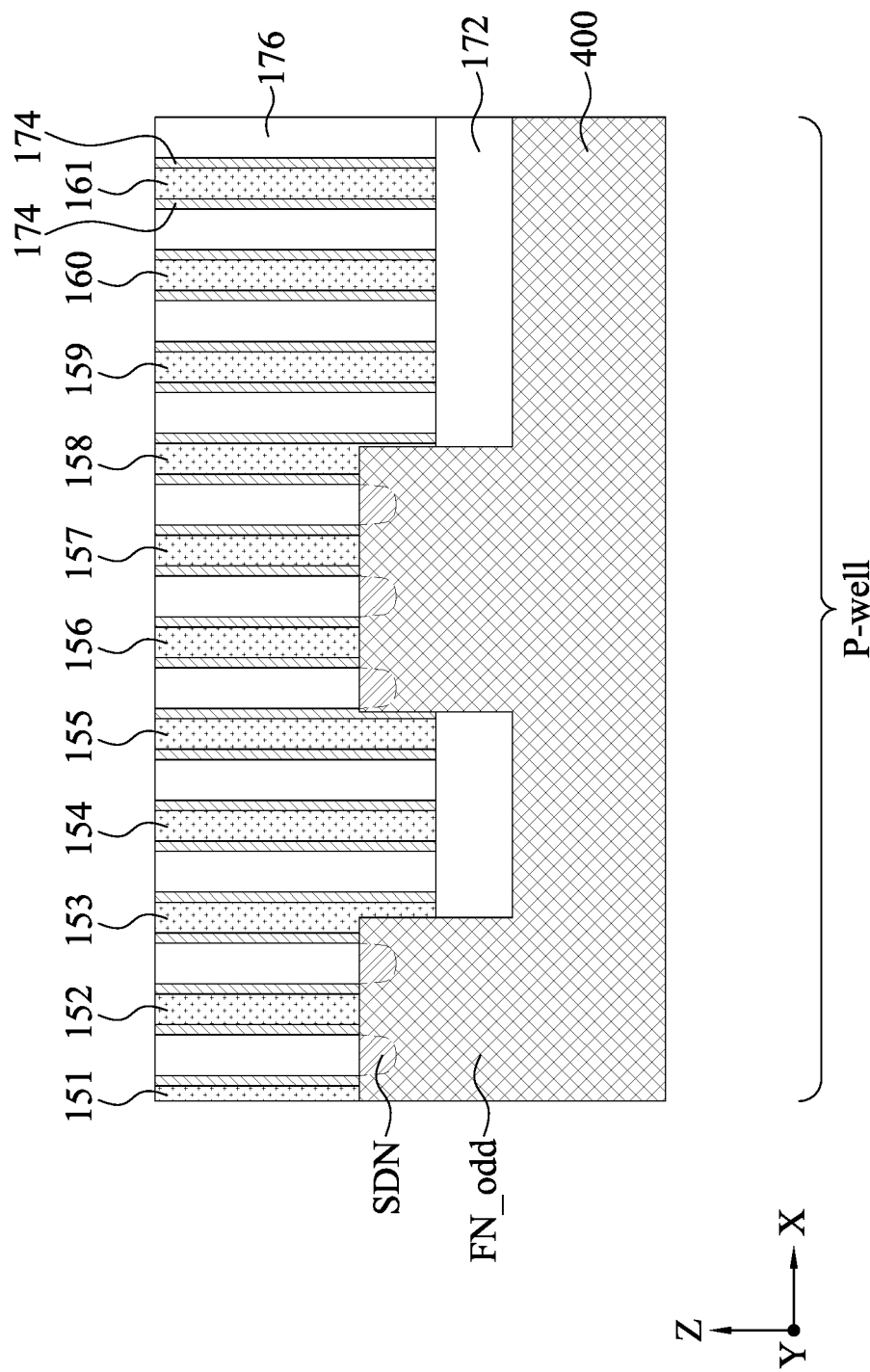
FIG. 4C is a cross-sectional view of the integrated circuit taken along C-C' line in FIG. 4A.
Figure 4E:
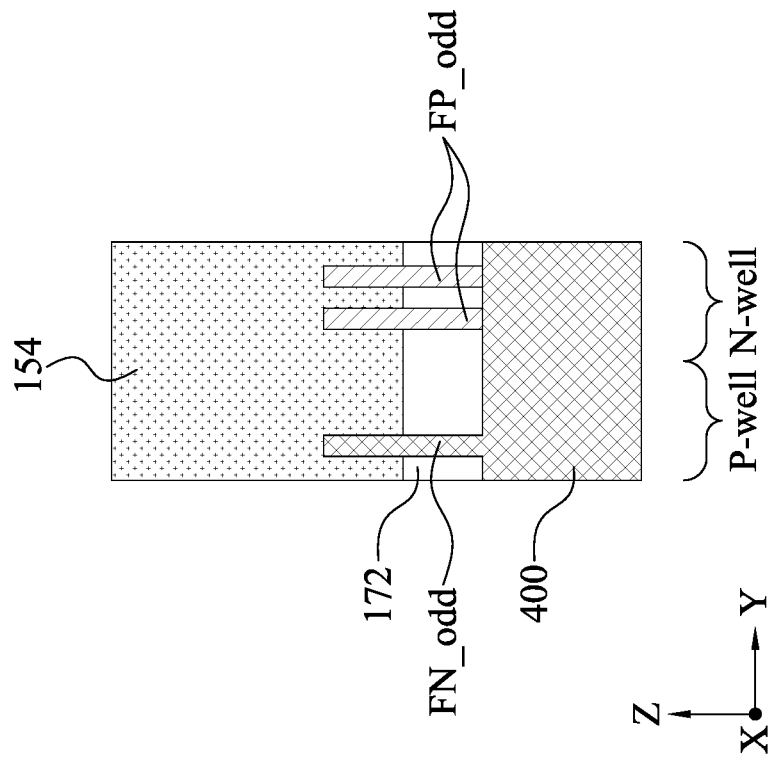
FIG. 4E is a cross-sectional view of the integrated circuit taken along E-E' line in FIG. 4A.
Figure 4D:
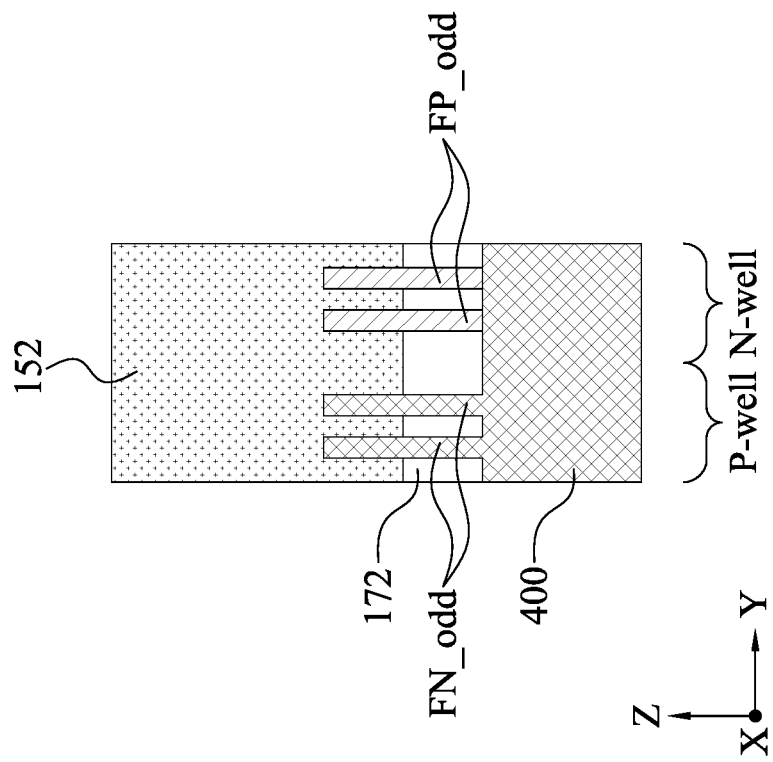
FIG. 4D is a cross-sectional view of the integrated circuit taken along D-D' line in FIG. 4A.

FIG. 4A illustrates a top view of an exemplary integrated circuit 100 having the fin layout of FIG. 3 in accordance with some embodiments. FIG. 4B is a cross-sectional view of the integrated circuit 100 taken along B-B' line in FIG. 4A, FIG. 4C is a cross-sectional view of the integrated circuit 100 taken along C-C' line in FIG. 4A, FIG. 4D is a cross-sectional view of the integrated circuit 100 taken along D-D' line in FIG. 4A, and FIG. 4E is a cross-sectional view of the integrated circuit 100 taken along E-E' line in FIG. 4A.

The integrated circuit 100 includes a substrate 400. The substrate 400 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 400 may include an epitaxial layer (epi-layer), which may be strained for performance enhancement, and/or may include a silicon-on-insulator (SOI) structure. In some embodiments, the substrate 400 is a non-SiGe substrate or a germanium-free substrate, such as, a silicon substrate.

The substrate 400 includes N-well regions and P-well regions alternately arranged along the Y-direction, as illustrated in FIG. 4A. The PFET fins FP_odd and FP_even extend within the N-well regions, and the NFET fins FN_odd and FN_even extend within the P-well regions. In some embodiments, N-well regions include N-type dopants, such as phosphorus and arsenic. In some other embodiments, P-well regions include P-type dopants such as boron. In some embodiments, the PFET fins FP_odd and FP_even are comprised of SiGe (for enhancing the strain effect), but the NFET fins FN_odd and FN_even are comprised of a non-SiGe semiconductor material or a germanium-free semiconductor material, for example silicon (Si). As such, the PFET fins FP_odd and FP_even may form a distinguishable interface with the Si substrate 400, and there may be no interface between the NFET fins FN_odd, FN_even and the Si substrate 400.

The integrated circuit 100 further includes gate structures 151, 152, 153, 154, 155, 156, 157, 158, 159, 160 and 161 that are spaced apart from each other by respective distances and each runs in the Y-direction across the rows Row1-Row4. The gate structures 151-161 wrap around three sides of the PFET fins FP_odd and FP_even and NFET fins FN_odd and FN_even. The gate structures 151-161 are equidistantly arranged at a gate pitch GP (i.e., center-to-center spacing between neighboring gate structures). In some embodiments, the odd-row height RH_odd of the odd rows (e.g., Row1 and Row3) is equal to or greater than triple the gate pitch GP. Moreover, fin length of the PFET fins FP_odd and FP_even (measured in the X-direction) is greater than or equal to twice the gate pitch GP, and the fin length of the NFET fins FN_odd and FN_even is greater than or equal to twice the gate pitch GP as well. In some embodiments, NFET fin break length B_odd between the neighboring NFET fins FN_odd (measured in the X-direction) in odd rows is greater than or equal to twice the gate pitch GP, and the NFET fin break length B_even between the neighboring NFET fins FN_even in even rows is greater than or equal to twice the gate pitch GP as well. These relationships with respect to the gate pitch GP are selected to improve the performance of the integrated circuit 100, e.g., RC delay improvement.

In the illustrated embodiments of FIG. 4A, the adjacent cells 111 and 112 share a single boundary gate structure 153 at their side boundary, and the adjacent cells 131 and 132 share a single boundary gate structure 153 at their side boundary as well. However, this arrangement is only for illustration purposes and not limiting. In some other embodiments, the adjacent cells 111 and 112 have separate boundary gate structures in the vicinity of the side boundary between the cells 111 and 112 but spaced apart by, e.g., source/drain regions, and the adjacent cells 131 and 132 have separate boundary gate structures in the vicinity of the side boundary between the cells 131 and 132 but spaced apart by, e.g., source/drain regions as well. Likewise, the adjacent cells 122 and 123 share a single boundary gate structure 157 at their side boundary, and the adjacent cells 142 and 143 share a single boundary gate structure 157 at their side boundary as well. However, this arrangement is only for illustration purposes and not limiting. In some other embodiments, the adjacent cells 122 and 123 have separate boundary gate structures in the vicinity of the side boundary between the cells 122 and 123 but spaced apart by, e.g., source/drain regions, and the adjacent cells 142 and 143 have separate boundary gate structures in the vicinity of the side boundary between the cells 142 and 143 but spaced apart by, e.g., source/drain regions.

The fins FN_odd, FP_odd, FN_even and FP_even are electrically isolated from each other by an isolation structure 172, as illustrated in FIGS. 4C-4E. In some embodiments, the isolation structure 172 is a shallow trench isolation (STI) structure including a trench filled with one or more dielectric material. In some embodiments, the STI structure includes silicon dioxide, silicon nitride, silicon oxynitride, or any other suitable insulating materials.

The STI structure 172 may be formed by depositing one or more dielectric materials (e.g., silicon oxide) to completely fill the trenches around the fins FN_odd, FP_odd, FN_even and FP_even and then recessing the top surface of the dielectric materials to fall below topmost ends of the fins FN_odd, FP_odd, FN_even and FP_even. The dielectric materials of the STI structure 172 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI structures 172 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI structure 172 such that upper portions of the fins FN_odd, FP_odd, FN_even and FP_even protrude from surrounding insulating STI structure 172.

The PFET fins FP_odd and FP_even each include channel regions overlapping with the corresponding gate structures 151-161, and P-type source/drain regions SDP located on opposite sides a corresponding one of the gate structures 151-161. The P-type source/drain regions SDP include P-type dopants such as boron. On the other hand, the NFET fins FN_odd and FN_even each include channel regions overlapping with the corresponding gate structures 151-161, and N-type source/drain regions SDN located on opposite sides a corresponding one of the corresponding gate structures 151-161. The N-type source/drain regions SDN include N-type dopants such as phosphorus and arsenic.

In some embodiments, the source/drain regions SDP and SDN may be epitaxially grown regions. For example, gate spacers 174 may be formed alongside dummy gate structures (which will be replaced with the final gate structures 151-161) by depositing a spacer material (e.g., silicon nitride, silicon oxide, silicon oxynitride or combinations thereof) and anisotropically etching the spacer material, and subsequently, the source/drain regions SDP and SDN may be formed self-aligned to the gate spacers 174. By way of example, the P-type source/drain regions SDP are formed by first etching the PFET fins FP_odd and FP_even to form recesses, and then depositing a crystalline semiconductor material (e.g., silicon germanium) in the recess by a selective epitaxial growth (SEG) process that may fill the recesses in the PFET fins FP_odd, FP_even and may extend further beyond the original surface of the PFET fins FP_odd, FP_even to form raised source/drain epitaxy structures in some embodiments. In some embodiments, P-type dopant (e.g., boron) is doped in the epitaxy structures to form P-type source/drain regions SDP. Likewise, the N-type source/drain regions SDN are formed by first etching the NFET fins FN_odd and FN_even to form recesses, and then depositing a crystalline semiconductor material (e.g., silicon or silicon carbide) in the recess by a selective epitaxial growth (SEG) process that may fill the recesses in the NFET fins FN_odd, FN_even and may extend further beyond the original surface of the NFET fins FN_odd, FN_even to form raised source/drain epitaxy structures in some embodiments. In some embodiments, N-type dopant (e.g., phosphorous or arsenic) is doped in the epitaxy structures to form N-type source/drain regions SDN.

The SEG process for forming the source/drain regions SDN, SDP may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to about $10^{16}$ cm$^{-2}$) of P-type dopant may be introduced into P-type source/drain regions SDP either in situ during SEG, or by an ion implantation process performed after the SEG, or by a combination thereof. Similarly, A high dose (e.g., from about $10^{14}$ cm$^{-2}$ to about $10^{16}$ cm$^{-2}$) of N-type dopant may be introduced into N-type source/drain regions SDN either in situ during SEG, or by an ion implantation process performed after the SEG, or by a combination thereof.

The integrated circuit 100 further includes an interlayer dielectric (ILD) layer 176 formed over source/drain regions SDN and SDP. Example materials of the ILD layer 176 include, but are not limited to, silicon oxide, spin-on glass (SOG), fluorinated silica glass (FSG), carbon doped silicon oxide, other suitable dielectric materials, and/or combinations thereof. In some embodiments, the ILD layer 176 is formed by a high density plasma (HDP) deposition process. In one or more embodiments, the ILD layer 176 is planarized by a chemical mechanical polishing (CMP) process to level with the gate spacers 174.

In some embodiments, the gate structures 151-161 are high-k metal gate (HKMG) structures that may be formed using a gate-last process flow (interchangeably referred to as gate replacement flow). In a gate-last process flow a sacrificial dummy gate structure (e.g., polysilicon gate, not shown) is formed after forming the STI structure 172. The dummy gate structure may comprise a dummy gate dielectric, a dummy gate electrode (e.g., polysilicon gate), and a hard mask. First a dummy gate dielectric material (e.g., silicon oxide, silicon nitride, or the like) may be deposited. Next a dummy gate material (e.g., polysilicon) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask layer and transferring that pattern to the dummy gate dielectric and dummy gate material using suitable photolithography and etching techniques. The dummy gate structure may extend along three sides of the protruding fins FP_odd, FN_odd, FP_even, FN_even and extend between adjacent two of the fins FP_odd, FN_odd, FP_even, FN_even over the surface of the STI structure 172. After forming the source/drain regions SDN, SDP and the ILD layer 176, the dummy gate structure is replaced by the HKMG gate structures 151-161. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In some embodiments, each of the HKMG gate structures 151-161 includes a high-k gate dielectric material and one or more gate metals. Exemplary high-k gate dielectric materials include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate metal (s) is formed over the gate dielectric. Exemplary gate metal(s) includes, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN). The gate replacement process includes, for example, removing the dummy gate structures by an etching process to form gate trenches between corresponding gate spacers 174, depositing a high-k gate dielectric layer and one or more gate metal layers into the gate trenches, and then performing a CMP process to remove excess materials of the high-k gate dielectric layer and the one or more gate metal layers outside the gate trenches until the ILD layer 176 is exposed.

Figure 5:
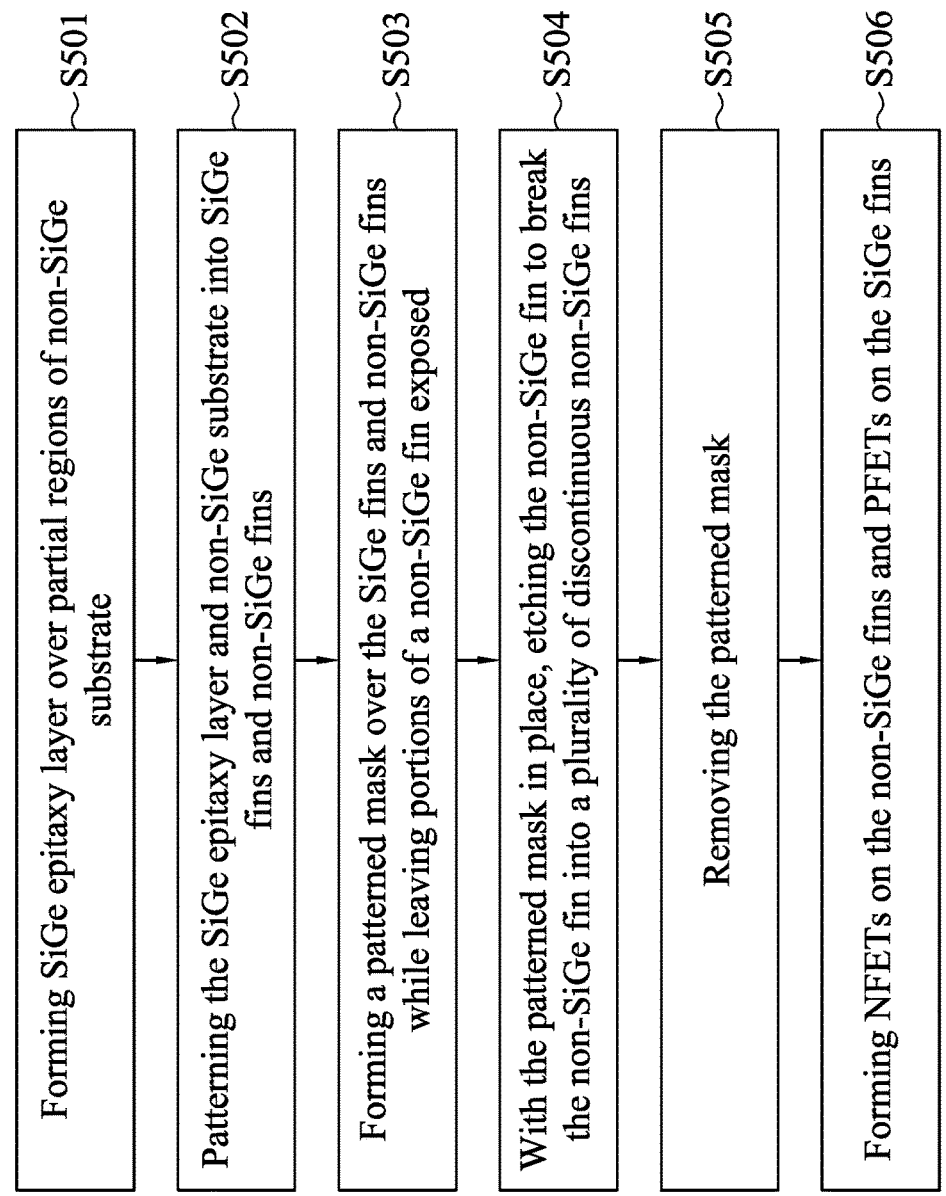
FIG. 5 is a flow chart of an example method of fabricating an integrated circuit in accordance with some embodiments of the present disclosure.

Illustrated in FIG. 5 is a flow chart of an example method 500 of fabricating the integrated circuit 100 in accordance with some embodiments of the present disclosure. FIGS. 6A-10C illustrate various processes at various stages of the method 500 of FIG. 5 in accordance with some embodiments of the present disclosure. Throughout the various views and illustrative embodiments, like reference numbers are used to designate like elements. In FIGS. 6A-10C, the "A" figures (e.g., FIGS. 6A, 7A, etc.) illustrate a top view, the "B" figures (e.g., FIGS. 6B, 7B, etc.) illustrates a cross-sectional view along Y direction corresponding to lines B-B' illustrated the "A" figures, and the "C" figures (e.g., FIG. 6C, 7C, etc.) illustrate a cross-sectional view along the Y direction corresponding to lines C-C' illustrated in in the "A" figures. It is understood that additional operations can be provided before, during, and after the processes shown by FIGS. 6A-10C, and some of the operations described below can be replaced or eliminated, for additional embodiments of the method. The order of the operations/processes may be interchangeable.

Figure 6A:
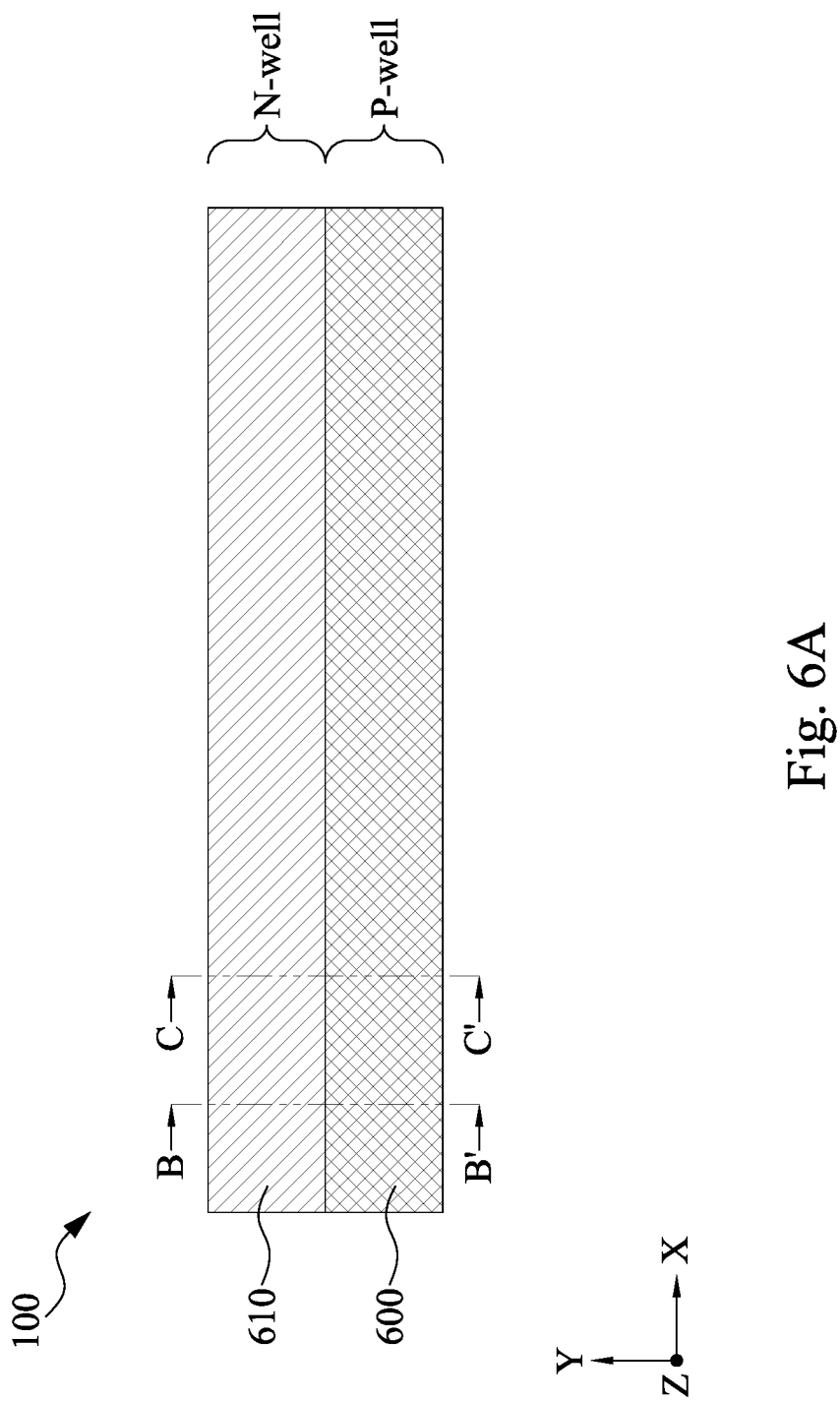
FIGS. 6A, 7A, 8A, 9A and 10A illustrate a top view of an integrated circuit at various manufacturing stages of the method of FIG. 5 in accordance with some embodiments of the present disclosure.
Figure 6B:
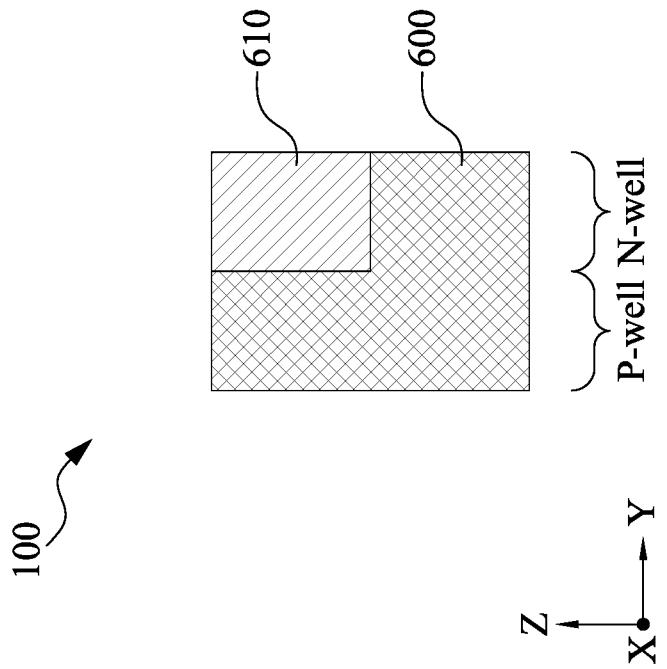
FIGS. 6B, 7B, 8B, 9B and 10B illustrate a cross-sectional view of an integrated circuit at various manufacturing stages of the method of FIG. 5 in accordance with some embodiments of the present disclosure.
Figure 6C:
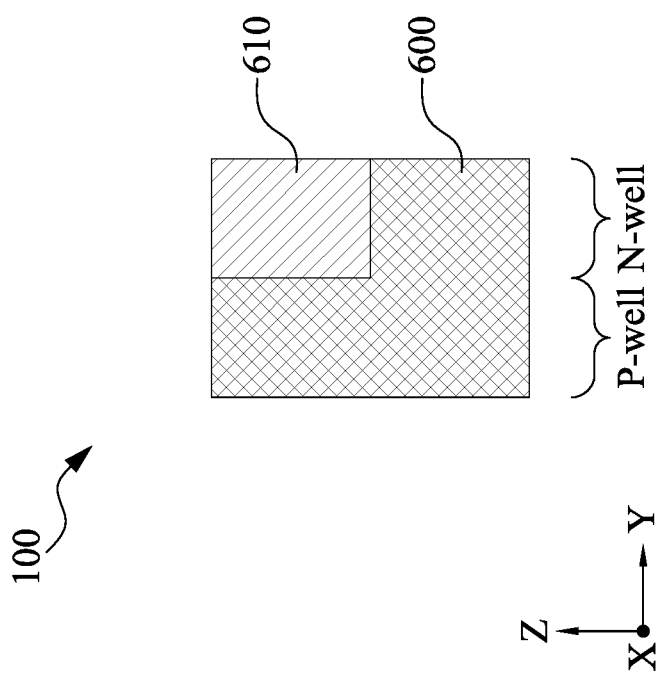
FIGS. 6C, 7C, 8C, 9C and 10C illustrate a cross-sectional view of an integrated circuit at various manufacturing stages of the method of FIG. 5 in accordance with some embodiments of the present disclosure.

In operation S501 of the method 500 of FIG. 5, a SiGe epitaxy layer 610 is formed over partial regions of a non-SiGe substrate 600, as shown in FIG. 6A-6C. In some embodiments, the non-SiGe substrate 600 may be made of a suitable non-germanium elemental semiconductor, such as silicon; a germanium-free alloy or compound semiconductor, such as Group-IV compound semiconductors (silicon carbide (SiC) or SiSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the non-SiGe substrate 600 may include an epitaxial layer (epi-layer), which may be strained for performance enhancement, and/or may include a silicon-on-insulator (SOI) structure.

The non-SiGe substrate 600 includes P-well regions and N-well regions alternately arranged along the Y-direction. In some embodiments, the N-type well regions and P-type well regions are formed by doping the non-SiGe substrate 600 with corresponding N-type and P-type dopants by ion implantation. Example P-type dopants include, but are not limited to, boron or $BF_2$. Example N-type dopants include, but are not limited to, phosphorus and arsenic. During forming the P-well regions, other regions of the non-SiGe substrate 600 are covered by a patterned mask. Likewise, during forming the N-well regions, other regions of the non-SiGe substrate 600 are covered by another patterned mask.

The SiGe epitaxy layer 610 is formed by, for example, recessing portions of the substrate 600 within the N-well regions using suitable photolithography and etching techniques, epitaxially growing the SiGe epitaxial layer from the recessed portions of the substrate 600, followed by performing an optional CMP process to planarize the SiGe epitaxial layer with the substrate 600.

Figure 7A:
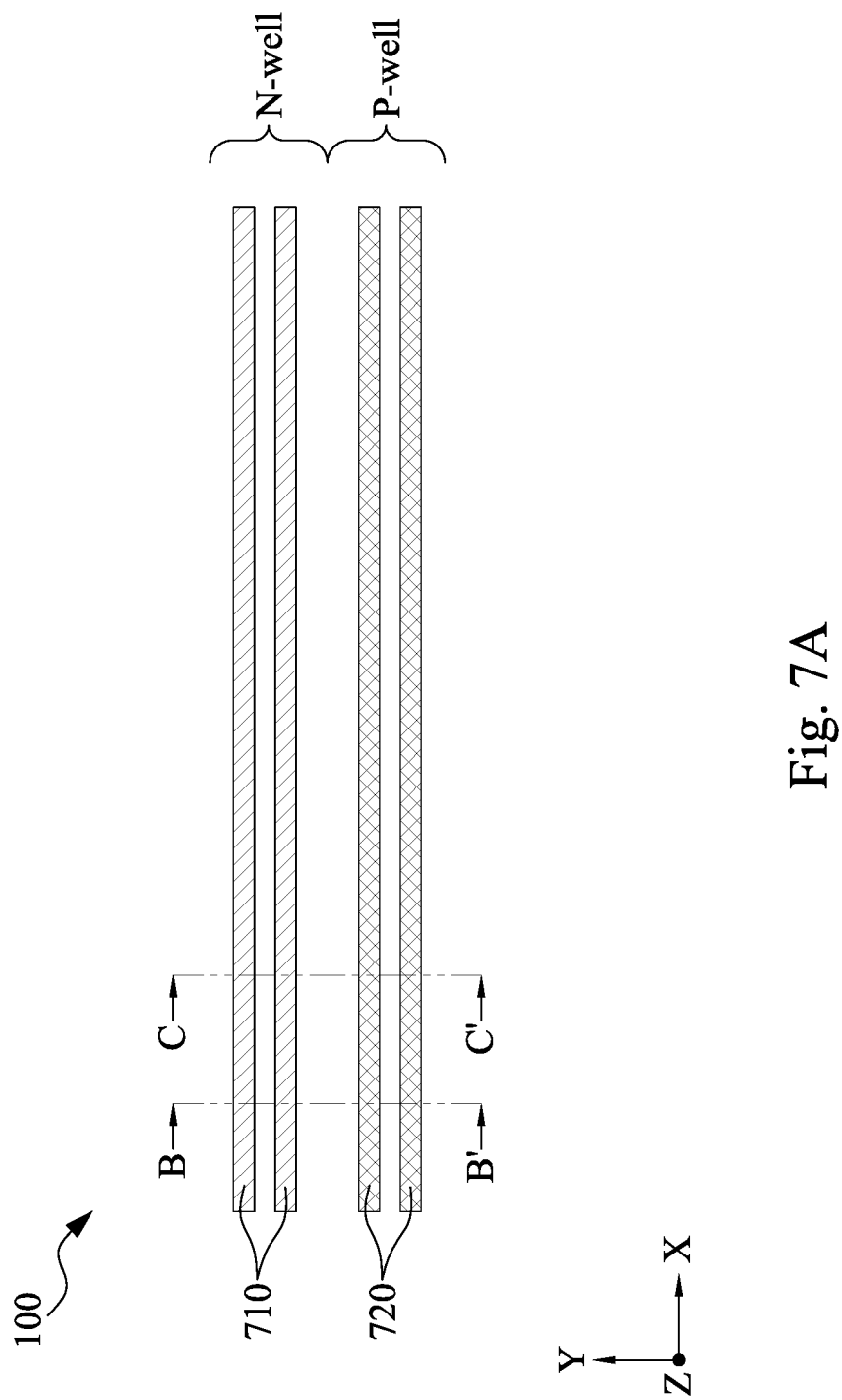
Figure 7B:
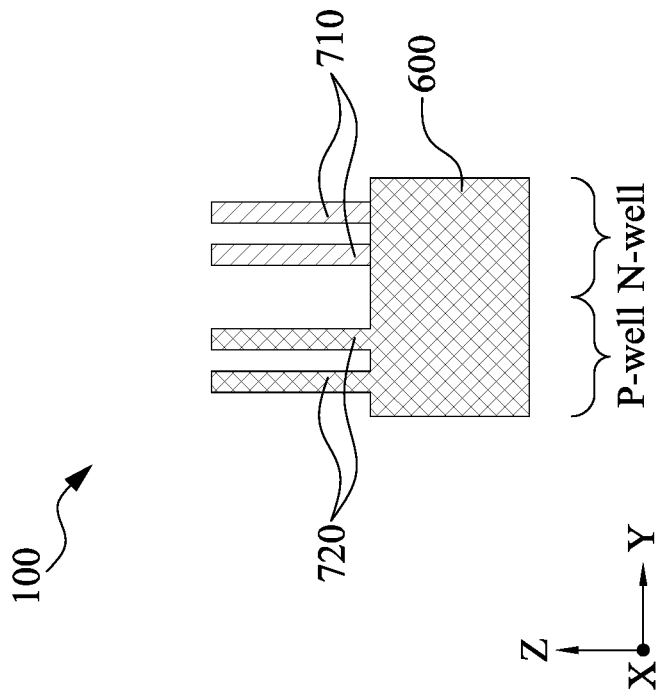
Figure 7C:
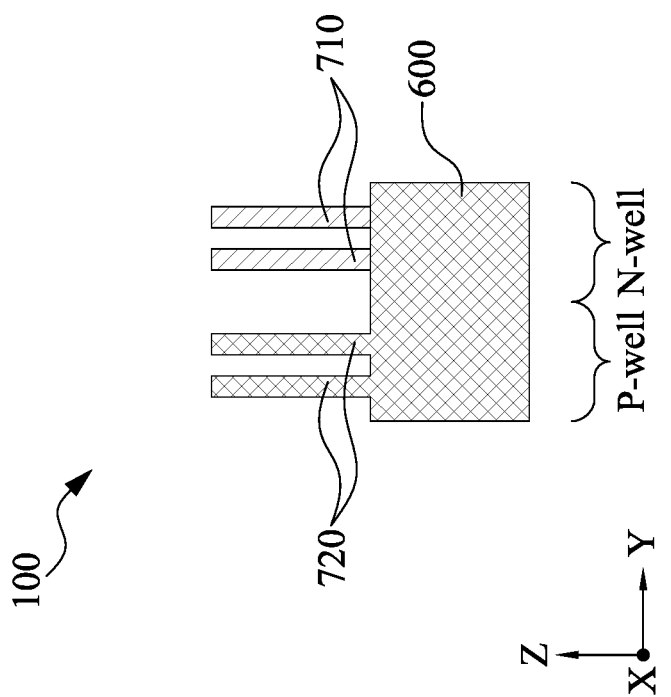

In operation S502 of the method 500 of FIG. 5, the SiGe layer 610 and the non-SiGe substrate 600 are patterned into SiGe fins 710 and non-SiGe fins 720, as shown in FIGS. 7A-7C. SiGe fins 710 and non-SiGe fins 720 may be formed by patterning the SiGe layer 610 (See FIGS. 6A-6C) and the non-SiGe substrate 600 using photolithography and etching techniques. For example, a spacer image transfer (SIT) patterning technique may be used to for the semiconductor fins. In this method a sacrificial layer is formed over the SiGe layer 610 and the non-SiGe substrate 600 and patterned to form mandrels using suitable photolithography and etch processes. Sidewall spacers are formed alongside the mandrels using a self-aligned process. The sacrificial layer is then removed by an appropriate selective etch process. Each remaining spacer may then be used as a hard mask to pattern the respective SiGe fins 710 and non-SiGe fins 720 by etching trenches into the SiGe layer 610 and the non-SiGe substrate 600 using, for example, reactive ion etching (RIE).

Figure 8A:
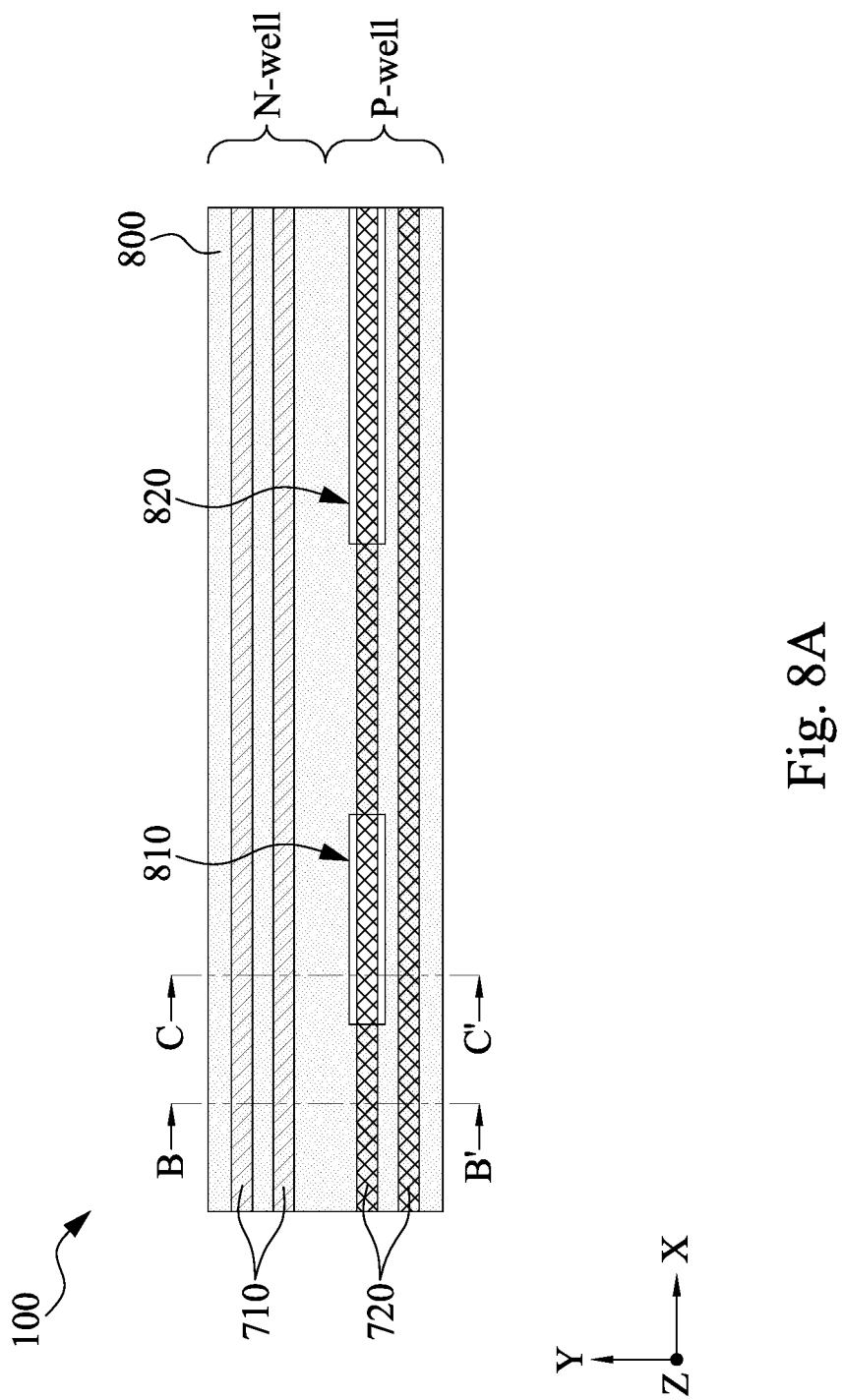
Figure 8C:
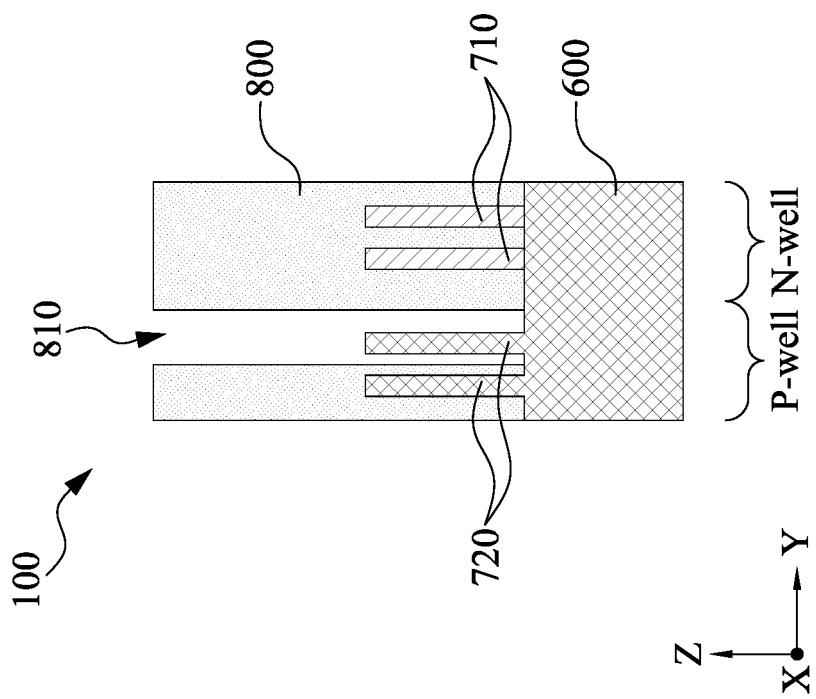
Figure 8B:
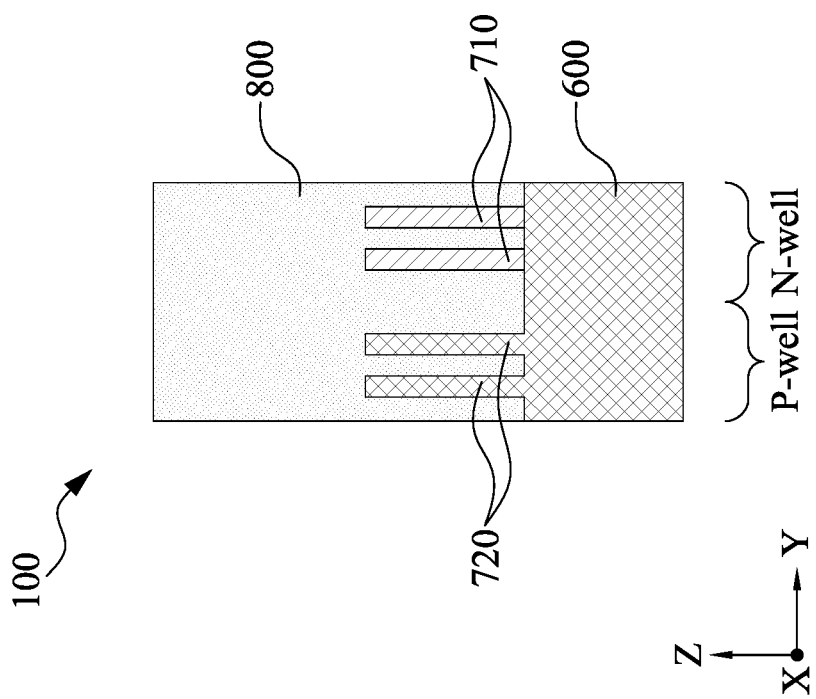

In operation S503 of the method 500 of FIG. 5, a patterned mask 800 is formed over the SiGe fins 710 and the non-SiGe fins 720 while leaving portions of a non-SiGe fin 720 exposed, as illustrated in FIGS. 8A-8C. In some embodiments, the patterned mask layer 800 may comprise an organic material, such as a photoresist material, and may be formed using a spin-on coating process, followed by patterning the photoresist material to forming a plurality of holes 810 and 820 extending through the patterned mask layer 800 using suitable lithography techniques. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, by way of example and not limitation, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. Thus, the holes 810 and 820 as illustrated in FIGS. 8A and 8C are formed in the patterned photoresist layer 800 to expose separate portions of a non-SiGe fin 720.

Figure 9A:
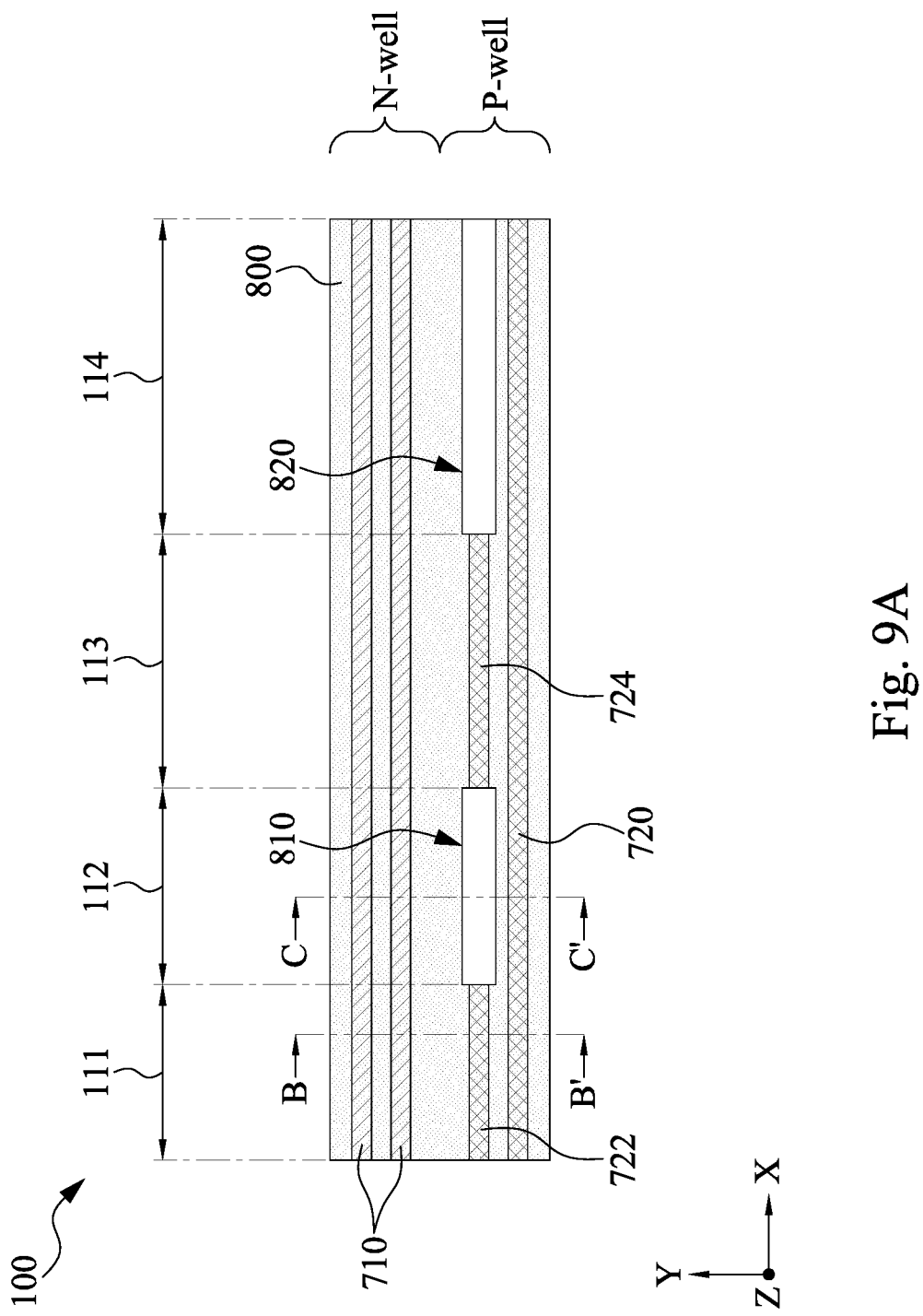
Figure 9C:
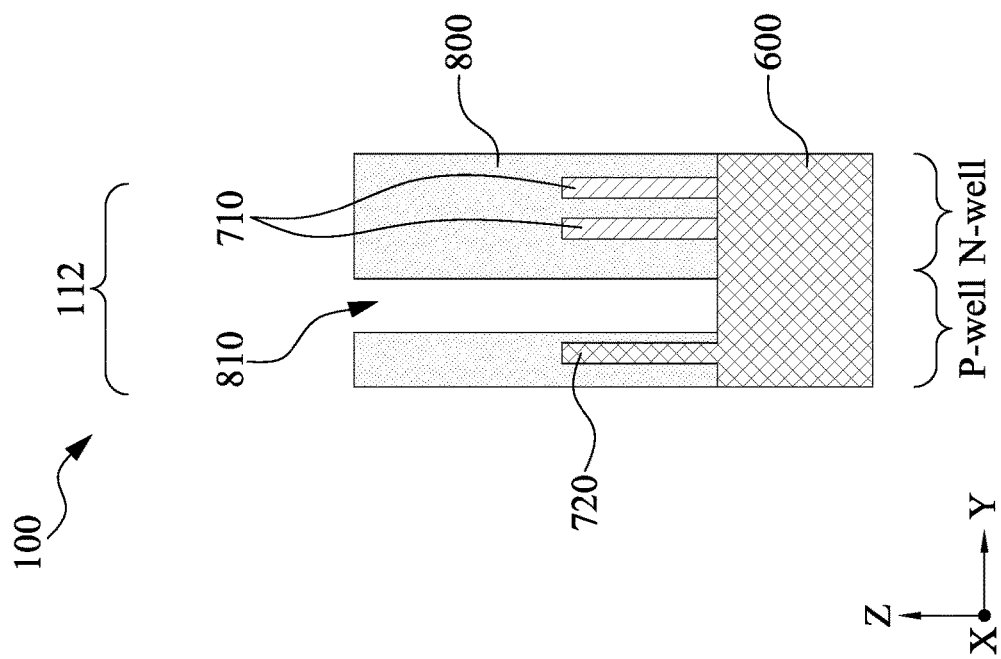
Figure 9B:
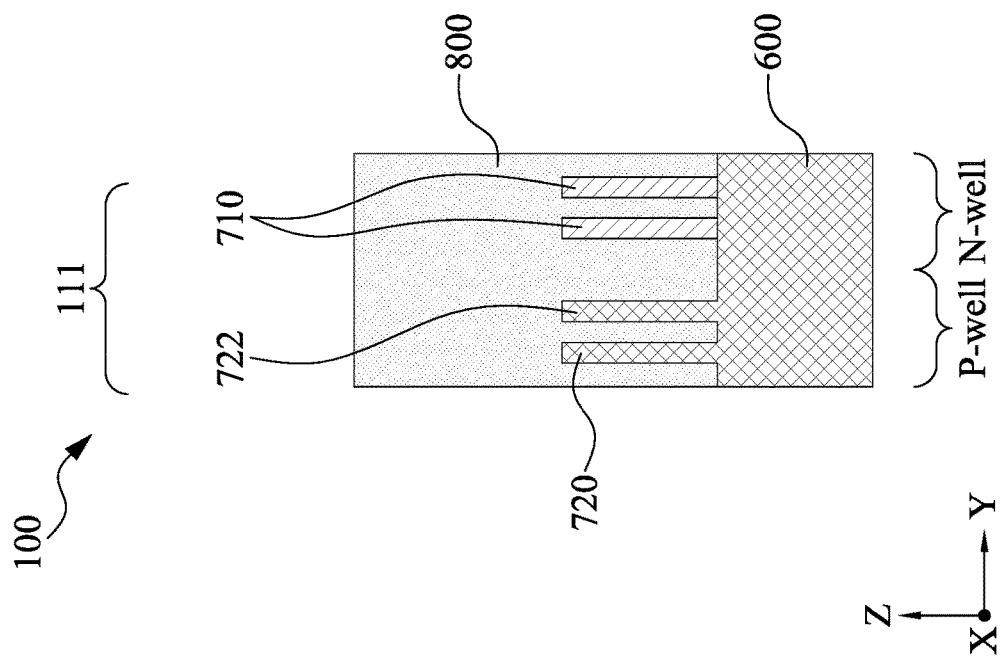

In operation S504 of the method 500 of FIG. 5, with the patterned mask 800 in place, the non-SiGe fin 720 exposed by the holes 810 and 820 of the patterned mask 800 is broken into a plurality of discontinuous non-SiGe fins 722 and 724 shorter than the neighboring non-SiGe fin 720, as illustrated in FIGS. 9A-9C. The fin breaking process (or referred to as fin cut process) can be performed using, for example, a dry etching process, wet etching process, and/or combinations thereof. As illustrated in FIG. 9A, the fin cut process breaks a non-SiGe fin 720 into discontinuous non-SiGe fins 722, 724 while leaving another non-SiGe fin 720 intact. Therefore, the fin cut process creates a 2P2N cell (cell having two SiGe fins and two non-SiGe fins) 111, a 2P1N cell (cell having two SiGe fins and one non-SiGe fin) 112, a 2P2N cell 113 and a 2P1N cell 114 arranged side-by-side along the X-direction.

Figure 10A:
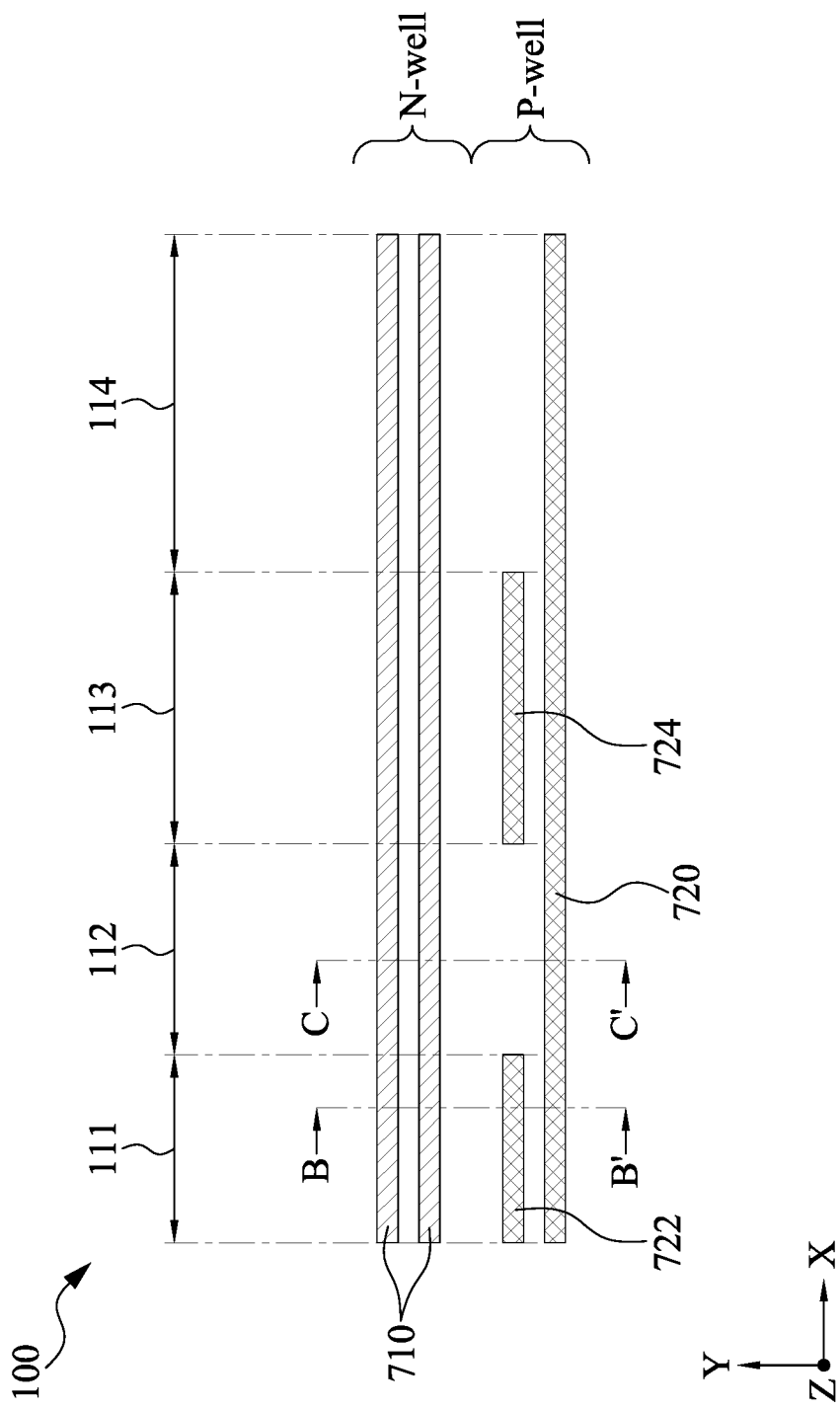
Figure 10C:
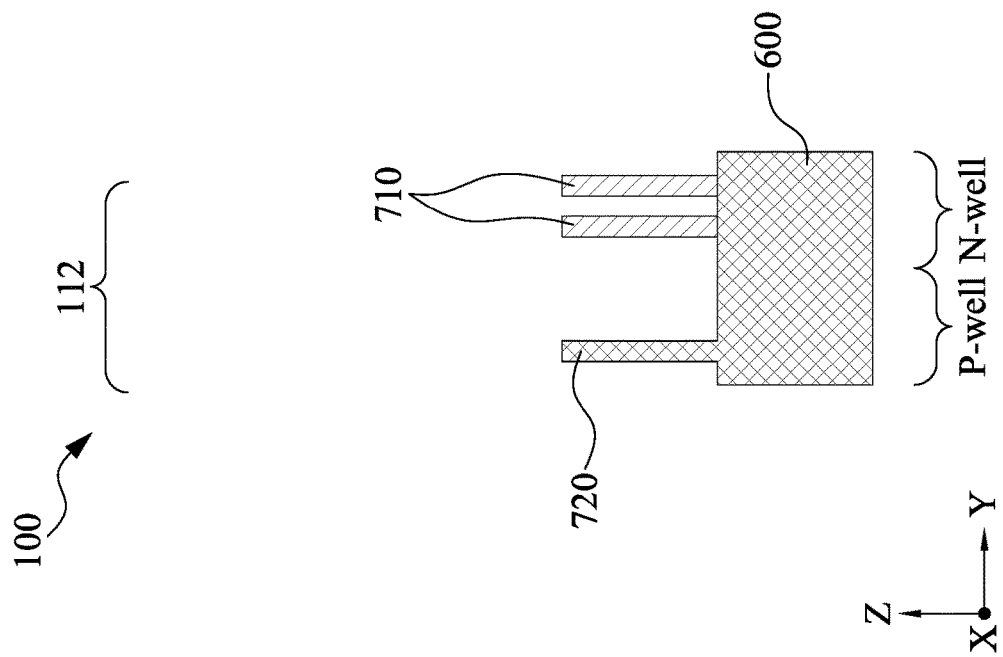
Figure 10B:
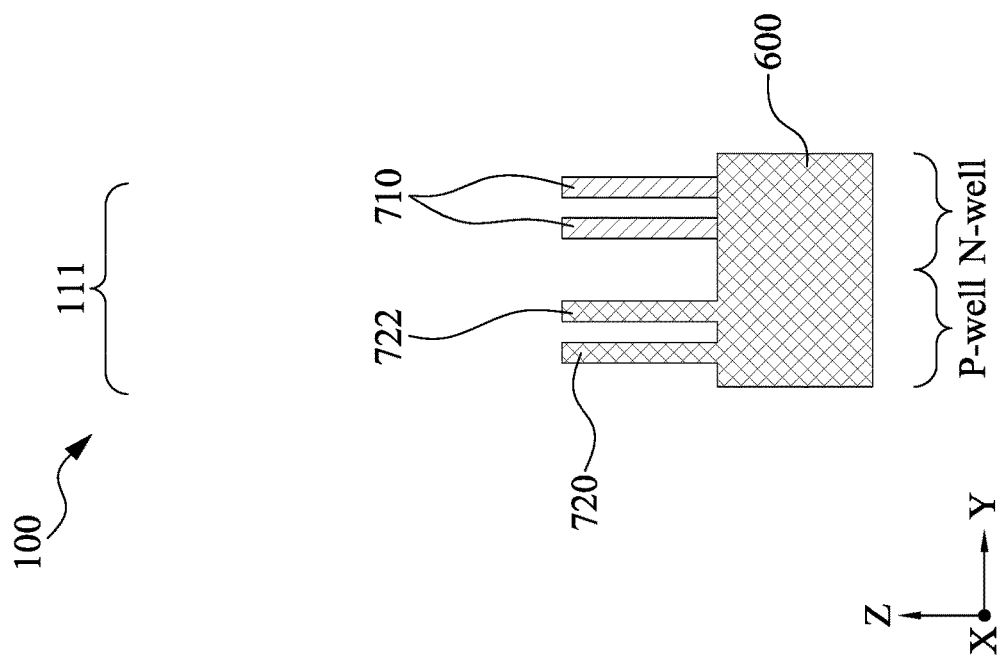

In operation S505 of the method 500 of FIG. 5, the patterned mask 800 is removed, for example, using a plasma ash process. In some embodiments, a plasma ash process is performed such that the temperature of the photoresist mask 800 is increased until the photoresist mask 800 experiences a thermal decomposition and may be removed. However, any other suitable process, such as a wet strip, may be utilized. The resulting structure is illustrated in FIGS. 10A-10C.

In operation S506 of the method 500 of FIG. 5, NFETs are formed on the non-SiGe fins 720, 722 and 724, and PFETs are formed on the SiGe fins 710. Fabrication of the NFETs and PFETs includes, for example, forming STI structures (e.g., the STI structures 172 as illustrated in FIGS. 4C-4E) laterally surrounding lower portions of the non-SiGe fins 720, 722 and 724 and SiGe fins 710, forming dummy gate structures (e.g., polysilicon gates) extending across the non-SiGe fins 720, 722 and 724 and SiGe fins 710 along the Y-direction, forming gate spacers (e.g., gate spacers 174 as illustrated in FIGS. 4A-4C) on opposite sidewalls of the dummy gate structures, forming P-type source/drain regions (e.g., P-type source/drain regions SDP as illustrated in FIG. 4B) in portions of the SiGe fins 710 exposed by the dummy gate structures and the gate spacers and N-type source/drain regions (e.g., N-type source/drain regions SDN as illustrated in FIG. 4C) in portions of the non-SiGe fins 720, 722 and 724 exposed by the dummy gate structures and the gate spacers, forming an ILD layer (e.g., the ILD layer 176 as illustrated in FIGS. 4B and 4C) over the source/drain regions, and replacing the dummy gate structures with replacement gate structures (e.g., the HKMG gate structures 151-161 as illustrated in FIG. 4A). The resulting structure is illustrated in FIGS. 4A-4E as discussed above.

Figure 11:
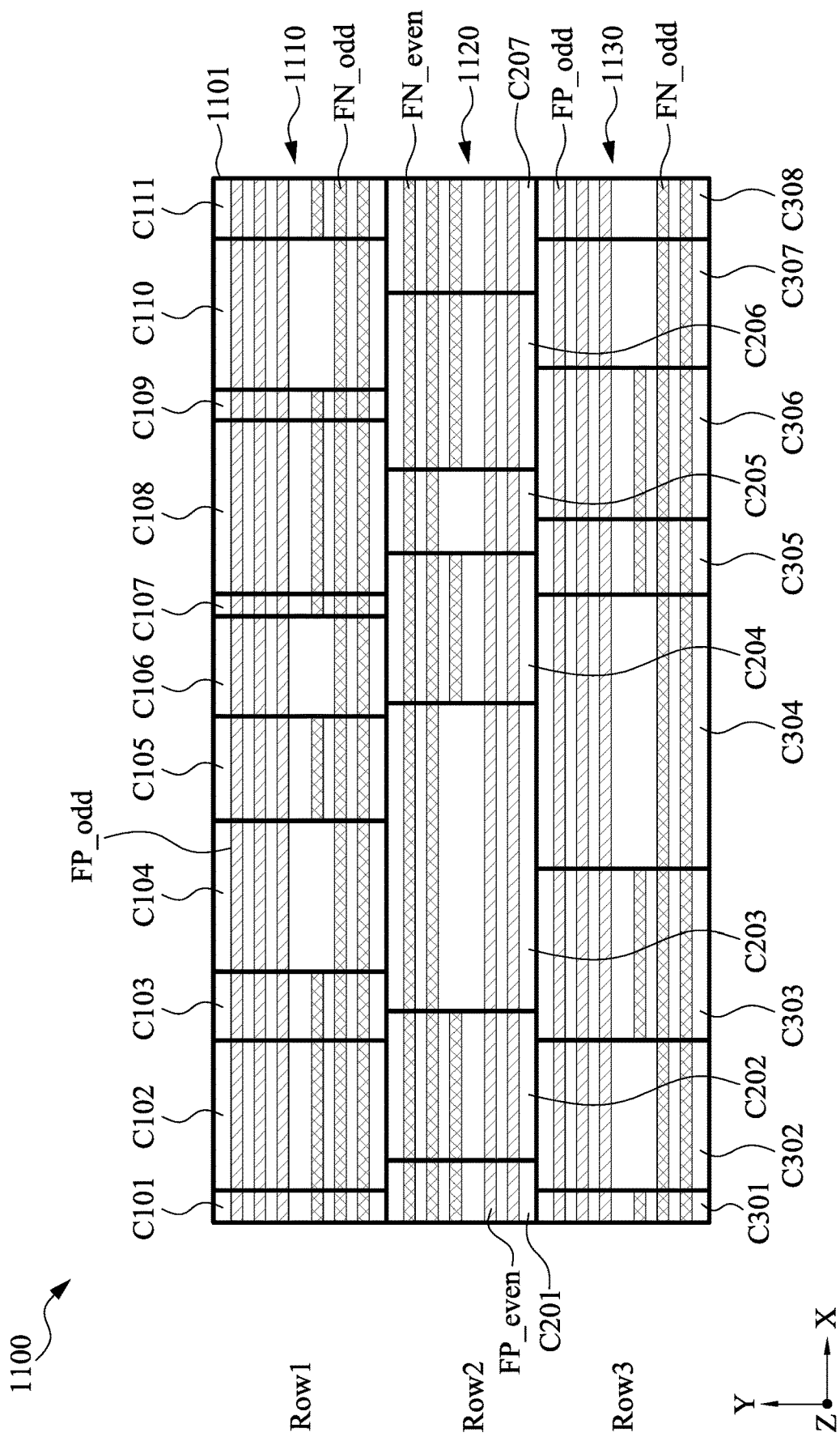
FIG. 11 illustrates a top view of a fin layout of some cells of another exemplary integrated circuit designed by systems and methods of the present disclosure, in accordance with some embodiments.

FIG. 11 illustrates a top view of a fin layout of some cells of an exemplary integrated circuit 1100 designed by systems and methods of the present disclosure, in accordance with some embodiments. Not all of the illustrated components are required, however, and some embodiments of the present disclosure may include additional components not shown in FIG. 11. Variations in the arrangement and type of the components may be made without departing from the scope of the present disclosure as set forth herein. Additional, different or fewer components may be included.

As illustrated in FIG. 11, the integrated circuit 1100 includes cell groups 1110, 1120 and 1130 arranged (i.e., laid out) in respective "cell rows" or "rows" with respect to a grid 1101. Further, in some embodiments, each cell group includes one or more cells disposed side-by-side along the respective row. For example, the cell group 1110 include cells C101, C102, C103, C104, C105, C106, C107, C108, C109, C110 and C111 that are arranged in the first row (Row1) of the grid 1101; the cell group 1120 includes cells C201, C202, C203, C204, C205, C206 and C207 that are arranged in the second row (Row2) of the grid 1101; the cell group 1130 includes cells C301, C302, C303, C304, C305, C306, C307 and C308 that are arranged in the third row (Row3) of the grid 1101.

The cells of the cell groups 1110, 1120 and 1130 are retrieved from respective standard cell libraries having different PFET fin numbers. By way of example and not limitation, the cells of the cell groups 1110 and 1130 are retrieved from an odd-row cell library including a plurality of odd-row cells, each of which share a first PFET fin number (e.g., three PFET fins); and the cells of the cell groups 1120 are retrieved from an even-row cell library including a plurality of even-row cells, each of which share a second PFET fin number (e.g., two PFET fins). Alternatively stated, the cells C101-C111 and C301-C308 are subsets of the odd-row cell library, and the cells C201-C207 are a subset of the even-row cell library. Each of the cells C101-C111 and C301-C308 in the odd-row cell library and the cells C201-C207 in the even-row cell library is associated with a specific logic function and/or characteristic (e.g., a timing characteristic). Accordingly, it is noted that although the cells C101-C111 and C301-C308 are retrieved from the odd-row cell library, not all of them share a same cell width. Similarly, although the cells C201-C207 are retrieved from the even-row cell library, not all of them share a same cell width.

In some embodiments, along the Row1 of grid 1101, the cells C101-C111 respectively include three PFET fins FP_odd continuously extending along the X-direction across the cells C101-C111; along the Row2 of grid 1101, the cells C201-C207 respectively include two PFET fins FP_even continuously extending along the X-direction across the cells C201-C207; along the Row3 of grid 1101, the cells C301-C308 respectively include three PFET fin FP_odd continuously extending along the X-direction across the cells C301-C308. In such a configuration, cells in a same odd row (e.g., Row1 or Row3) share a same PFET fin number (e.g., three PFET fins FP_odd), and cells in in a same even row (e.g., Row2) share a same PFET fin number (e.g., two PFET fins FP_even). As a result, all of the PFET fins FP_odd and FP_even are free from a fin cut process, so that the stress relaxation in the PFET fins FP_odd and FP_even resulting from the fin cut process can be prevented.

Moreover, along the Row1 of the grid 1101, the cells C101, C102, C103, C105, C107, C108, C109 and C111 respectively include three NFET fins FN_odd, and the cells C104, C106 and C110 respectively include two NFET fins FN_odd; along the Row 3 of the grid 1101, the cells C301, C303, C305, C306 respectively include three NFET fins FN_odd, and the cells C302, C304, C307 and C308 respectively include two NFET fins FN_odd; along the Row 2 of the grid 1101, the cells C201, C202, C204, C206 and C207 respectively include three NFET fins FN_even, and the cells C203 and C205 respectively include two NFET fins FN_even.

The NFET fins of cells in the Row1-Row3 can be fabricated using a fin cut process to break a single continuous NFET fin into a plurality of discontinuous NFET fins, as discussed previously with respect to FIGS. 6A-10C. Because NFET fins (e.g., germanium-free silicon fins) suffer less stress relaxation caused by fin cut process as compared to the PFET fins (e.g., SiGe fin), the fin cut process for fabricating the discontinuous NFET fins will result in no or negligible impact on ON-currents of the NFETs of the cells in the Row1-Row3.

The cells C101, C102, C103, C105, C107, C108, C109 and C111 in Row1 and the C301, C303, C305, C306 in Row3 have three PFET fins FP_odd and three NFET fins FN_odd, and thus these cells can be identified as 3P3N cells in the odd-row cell library. The cells C104, C106 and C110 in Row1 and the cells C302, C304, C307 and C308 in Row3 have three PFET fins FP_odd and two NFET fins FN_odd, and thus these cells can be identified as 3P2N cells in the odd-row cell library. The cells C201, C202, C204, C206 and C207 in Row2 have two PFET fins FP_even and three NFET fins FN_even, and thus these cells can be identified as 2P3N cells in the even-row cell library. The cells C203 and C205 in Row2 have two PFET fins FP_even and two NFET fins FN_even, and thus these cells can be identified as 2P2N cells in the even-row cell library. As a result, the odd-row cell library includes at least 3P3N cells and 3P2N cells, and the even-row cell library includes at least 2P3N cells and 2P2N cells. A maximal fin number of cells in the odd-row cell library (e.g., six fins) is thus greater than a maximal fin number of cells in the even-row cell library (e.g., five fins). Therefore, the odd-row cells can operate at a higher speed, and are thus applicable for high speed applications. The even-row cells can operate with less power, and are thus usable for low power applications. However, in some other embodiments, a maximal fin number of cells in the odd-row cell library can be less than a maximal fin number of cells in the even-row cell library, and thus the odd-row cells are usable for low power applications and the even-row cells are applicable for high speed applications. In some embodiments, the integrated circuit 1100 including 3P3N cells and 3P2N cells in speed-oriented rows, 2P3N cells and 2P2N cells in power-oriented rows is applicable for server chips.

In the integrated circuit 1100 applicable for server chips, the row height of the speed-oriented rows (e.g., Row1 and Row3) is equal to or greater than triple the gate pitch of the integrated circuit 1100; the PFET fin number of the speed-oriented rows is equal to or greater than three; the NFET fin number of the speed-oriented rows is greater than or equal to one; the fin length of fins in the speed-oriented rows is greater than or equal to twice the gate pitch of the integrated circuit 1100; and the NFET fin break length in between neighboring NFET fins in the speed-oriented rows is greater than or equal to twice the gate pitch of the integrated circuit 1100.

Moreover, in the integrated circuit 1100 applicable for server chips, the row height of the power-oriented rows (e.g., Row2) is equal to or less than the row height of the speed-oriented rows (e.g., Row1 and Row3); the PFET fin number of the power-oriented rows is equal to or less than the PFET fin number of the speed-oriented rows; the NFET fin number of the power-oriented rows is greater than or equal to one; the fin length of fins in the power-oriented rows is greater than or equal to twice the gate pitch of the integrated circuit 1100; and the NFET fin break length between neighboring NFET fins in the power-oriented rows is greater than or equal to twice the gate pitch of the integrated circuit 1100.

Figure 12:
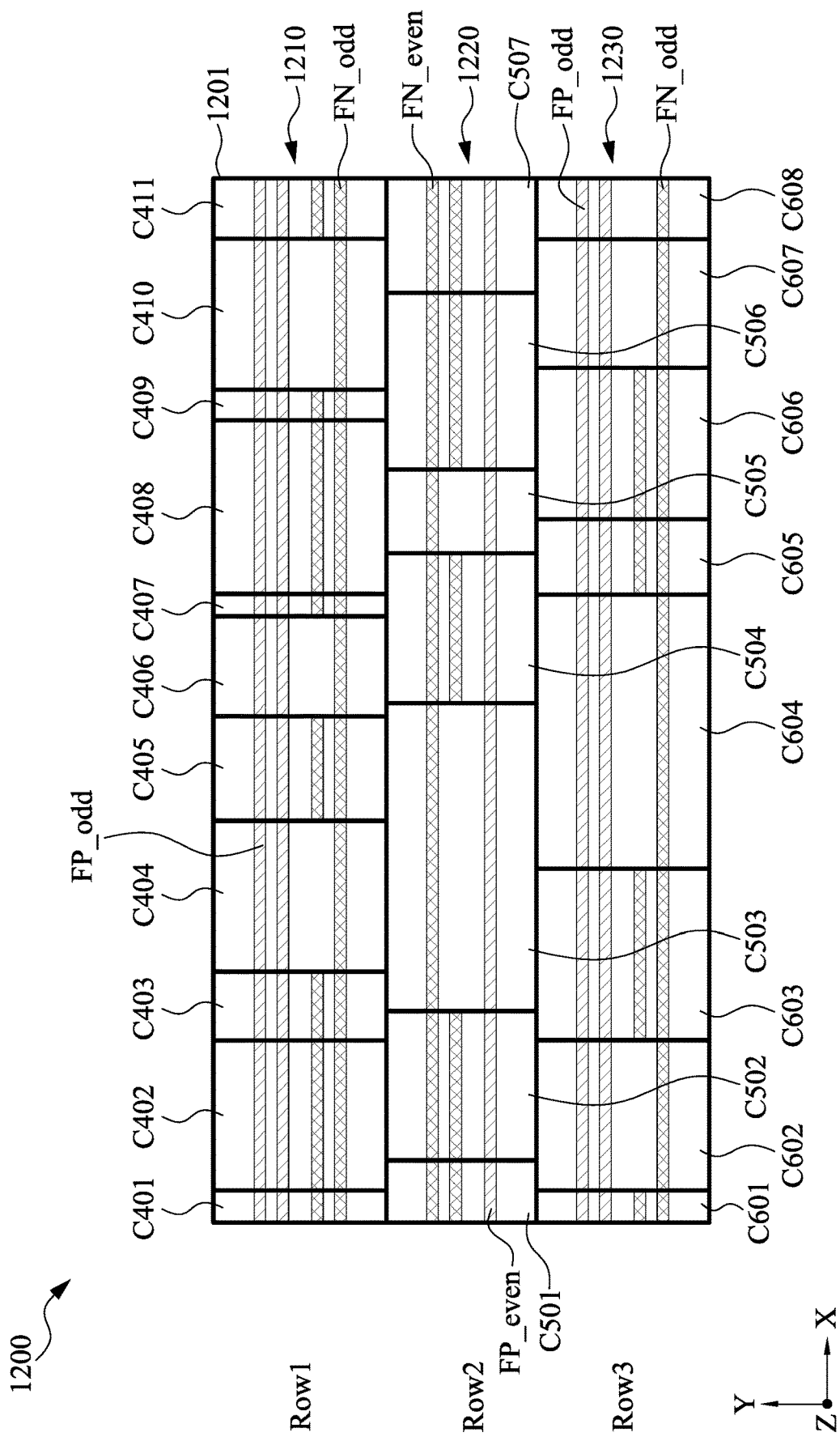
FIG. 12 illustrates a top view of a fin layout of some cells of yet another exemplary integrated circuit designed by systems and methods of the present disclosure, in accordance with some embodiments.

FIG. 12 illustrates a top view of a fin layout of some cells of an exemplary integrated circuit 1200 designed by systems and methods of the present disclosure, in accordance with some embodiments. Not all of the illustrated components are required, however, and some embodiments of the present disclosure may include additional components not shown in FIG. 12. Variations in the arrangement and type of the components may be made without departing from the scope of the present disclosure as set forth herein. Additional, different or fewer components may be included.

As illustrated in FIG. 12, the integrated circuit 1200 includes cell groups 1210, 1220 and 1230 arranged in respective with respect to a grid 1201. Further, in some embodiments, each cell group includes one or more cells disposed side-by-side along the respective row. For example, the cell group 1210 include cells C401, C402, C403, C404, C405, C406, C407, C408, C409, C410 and C411 that are arranged in the first row (Row1) of the grid 1201; the cell group 1220 includes cells C501, C502, C503, C504, C505, C506 and C507 that are arranged in the second row (Row2) of the grid 1201; the cell group 1230 includes cells C601, C602, C603, C604, C605, C606, C607 and C608 that are arranged in the third row (Row3) of the grid 1201.

The cells of the cell groups 1210, 1220 and 1230 are retrieved from respective standard cell libraries having different PFET fin numbers. By way of example and not limitation, the cells of the cell groups 1210 and 1230 are retrieved from an odd-row cell library including a plurality of odd-row cells, each of which share a first PFET fin number (e.g., two PFET fins); and the cells of the cell groups 1220 are retrieved from an even-row cell library including a plurality of even-row cells, each of which share a second PFET fin number (e.g., one PFET fin). Alternatively stated, the cells C401-C411 and C601-C608 are subsets of the odd-row cell library, and the cells C501-0507 are a subset of the even-row cell library. Each of the cells C401-C411 and C601-C608 in the odd-row cell library and the cells C501-0507 in the even-row cell library is associated with a specific logic function and/or characteristic (e.g., a timing characteristic). Accordingly, it is noted that although the cells C401-C411 and C601-C608 are retrieved from the odd-row cell library, not all of them share a same cell width. Similarly, although the cells C501-0507 are retrieved from the even-row cell library, not all of them share a same cell width.

In some embodiments, along the Row1 of grid 1201, the cells C401-C411 respectively include two PFET fins FP_odd continuously extending along the X-direction across the cells C401-C411; along the Row2 of grid 1201, the cells C501-0507 respectively include one PFET fin FP_even continuously extending along the X-direction across the cells C501-0507; along the Row3 of grid 1201, the cells C601-C608 respectively include two PFET fin FP_odd continuously extending along the X-direction across the cells C601-C608. In such a configuration, cells in a same odd row (e.g., Row1 or Row3) share a same PFET fin number (e.g., two PFET fins FP_odd), and cells in in a same even row (e.g., Row2) share a same PFET fin number (e.g., one PFET fins FP_even). As a result, all of the PFET fins FP_odd and FP_even are free from a fin cut process, so that the stress relaxation in the PFET fins FP_odd and FP_even resulting from the fin cut process can be prevented.

Moreover, along the Row1 of the grid 1201, the cells C401, C402, C403, C405, C407, C408, C409 and C411 respectively include two NFET fins FN_odd, and the cells C404, C406 and C410 respectively include one NFET fins FN_odd; along the Row 3 of the grid 1201, the cells C601, C603, C605, C606 respectively include two NFET fins FN_odd, and the cells C602, C604, C607 and C608 respectively include one NFET fin FN_odd; along the Row 2 of the grid 1201, the cells C501, C502, C504, C506 and C507 respectively include two NFET fins FN_even, and the cells C503 and C505 respectively include one NFET fin FN_even. The NFET fins of cells in the Row1-Row3 can be fabricated using a fin cut process to break a single continuous NFET fin into a plurality of discontinuous NFET fins, as discussed previously with respect to FIGS. 6A-10C.

The cells C401, C402, C403, C405, C407, C408, C409 and C411 in Row1 and the C601, C603, C605, C606 in Row3 have two PFET fins FP_odd and two NFET fins FN_odd, and thus these cells can be identified as 2P2N cells in the odd-row cell library. The cells C404, C406 and C410 in Row1 and the cells C602, C604, C607 and C608 in Row3 have two PFET fins FP_odd and one NFET fins FN_odd, and thus these cells can be identified as 2P1N cells in the odd-row cell library. The cells C501, C502, C504, C506 and C507 in Row2 have one PFET fin FP_even and two NFET fins FN_even, and thus these cells can be identified as 1P2N cells in the even-row cell library. The cells C503 and C505 in Row2 have one PFET fin FP_even and one NFET fin FN_even, and thus these cells can be identified as 1P1N cells in the even-row cell library. As a result, the odd-row cell library includes at least 2P2N cells and 2P1N cells, and the even-row cell library includes at least 1P2N cells and 1P1N cells. A maximal fin number of cells in the odd-row cell library (e.g., four fins) is thus greater than a maximal fin number of cells in the even-row cell library (e.g., three fins). Therefore, the odd-row cells can operate at a higher speed, and are thus applicable for high speed applications. The even-row cells can operate with less power, and are thus usable for low power applications. However, in some other embodiments, a maximal fin number of cells in the odd-row cell library can be less than a maximal fin number of cells in the even-row cell library, and thus the odd-row cells are usable for low power applications and the even-row cells are applicable for high speed applications. In some embodiments, the integrated circuit 1200 including 2P2N cells and 2P1N cells in speed-oriented rows, 1P2N cells and 1P1N cells in power-oriented rows is applicable for mobile chips.

In the integrated circuit 1200 applicable for mobile chips, the row height of the speed-oriented rows (e.g., Row1 and Row3) is greater than or equal to twice the gate pitch of the integrated circuit 1200; the PFET fin number of the speed-oriented rows is equal to or greater than two; the NFET fin number of the speed-oriented rows is greater than or equal to one; the fin length of fins in the speed-oriented rows is greater than or equal to twice the gate pitch of the integrated circuit 1200; and the NFET fin break length in between neighboring NFET fins in the speed-oriented rows is greater than or equal to twice the gate pitch of the integrated circuit 1200.

Moreover, in the integrated circuit 1200 applicable for mobile chips, the row height of the power-oriented rows (e.g., Row2) is equal to or less than the row height of the speed-oriented rows (e.g., Row1 and Row3); the PFET fin number of the power-oriented rows is equal to or less than the PFET fin number of the speed-oriented rows; the NFET fin number of the power-oriented rows is greater than or equal to one; the fin length of fins in the power-oriented rows is greater than or equal to twice the gate pitch of the integrated circuit 1200; and the NFET fin break length between neighboring NFET fins in the power-oriented rows is greater than or equal to twice the gate pitch of the integrated circuit 1200.

Figure 13:
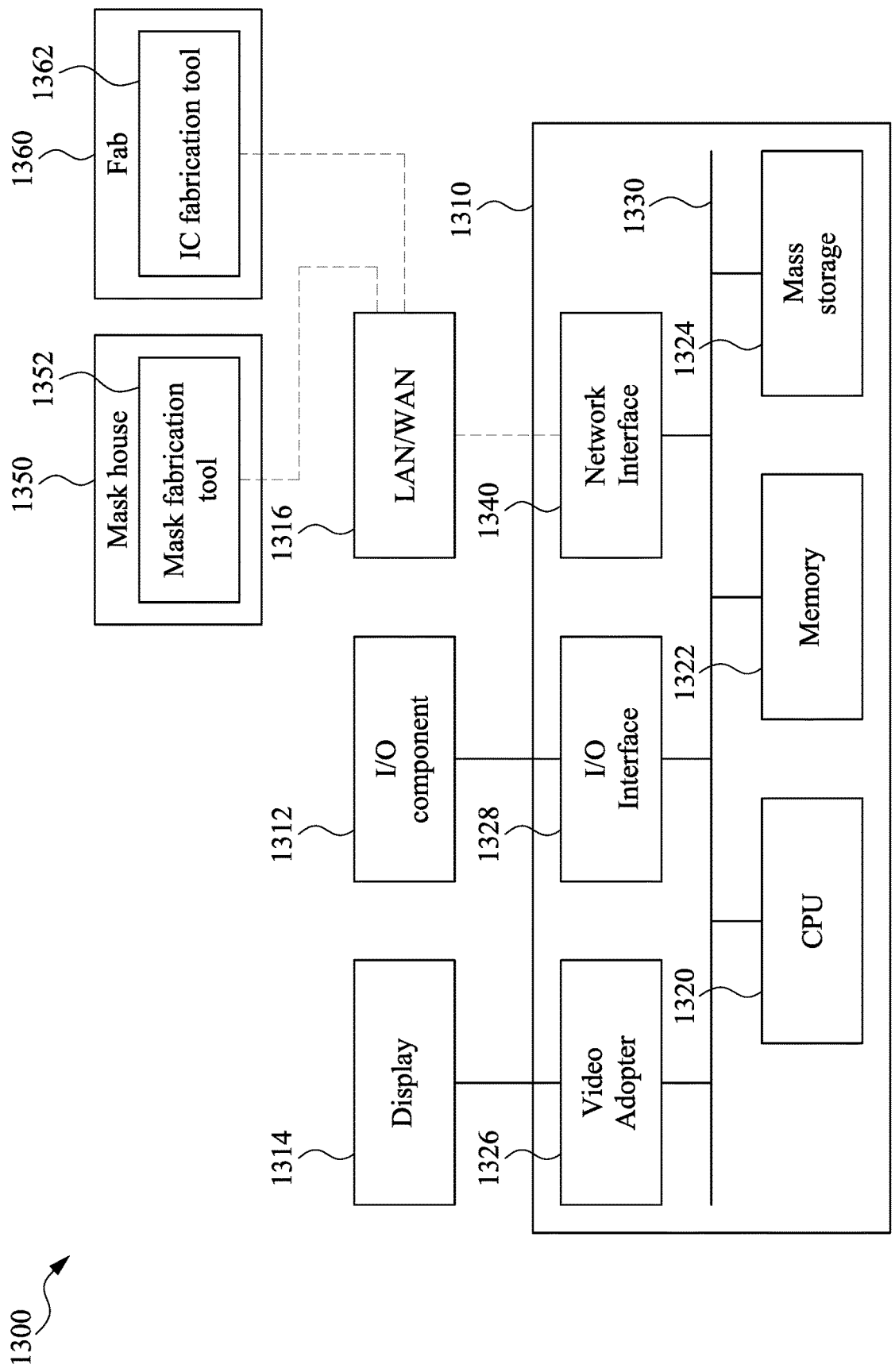
FIG. 13 is a block diagram including an information handling system (IHS), a mask house and a fab in accordance with some embodiments of the present disclosure.

Referring now to FIG. 13, a block diagram of an information handling system (IHS) 1300 is provided, in accordance with some embodiments of the present disclosure. The IHS 300 may be a computer platform used to implement any or all of the processes discussed herein to design an integrated circuit with mixed row fin numbers (e.g., the integrated circuits 100, 1100, and 1200). The IHS 1300 may comprise a processing unit 1310, such as a desktop computer, a workstation, a laptop computer, or a dedicated unit customized for a particular application. The IHS 1300 may be equipped with a display 1314 and one or more input/output (I/O) components 1312, such as a mouse, a keyboard, or printer. The processing unit 1310 may include a central processing unit (CPU) 1320, memory 1322, a mass storage device 1324, a video adapter 1326, and an I/O interface 1328 connected to a bus 1330.

The bus 1330 may be one or more of any type of several bus architectures including a memory bus or memory controller, a peripheral bus, or video bus. The CPU 1320 may comprise any type of electronic data processor, and the memory 1322 may comprise any type of system memory, such as static random access memory (SRAM), dynamic random access memory (DRAM), or read-only memory (ROM).

The mass storage device 1324 may comprise any type of storage device configured to store data, programs, and other information and to make the data, programs, and other information accessible via the bus 1330. The mass storage device 1324 may comprise, for example, one or more of a hard disk drive, a magnetic disk drive, an optical disk drive, or the like.

The video adapter 1326 and the I/O interface 1328 provide interfaces to couple external input and output devices to the processing unit 1310. As illustrated in FIG. 13, examples of input and output devices include the display 1314 coupled to the video adapter 1326 and the I/O components 1312, such as a mouse, keyboard, printer, and the like, coupled to the I/O interface 1328. Other devices may be coupled to the processing unit 1310, and additional or fewer interface cards may be utilized. For example, a serial interface card (not shown) may be used to provide a serial interface for a printer. The processing unit 1310 also may include a network interface 1340 that may be a wired link and/or a wireless link to a local area network (LAN) or a wide area network (WAN) 1316. The IHS 1300 may include other components/devices. For example, the IHS 1300 may include power supplies, cables, a motherboard, removable storage media, cases, and the like. These other components/devices, although not shown, are considered part of the IHS 1300.

In some embodiments of the present disclosure, an Electronic Design Automation (EDA) is program code that is executed by the CPU 1320 to analyze a user file to obtain the layout of an integrated circuit (e.g., the integrated circuits 100, 1100, and 1200 as discussed above). Further, during the execution of the EDA, the EDA may analyze functional components of the layout. The program code may be accessed by the CPU 1320 via the bus 1330 from the memory 1322, mass storage device 1324, or the like, or remotely through the network interface 1340.

Also illustrated in FIG. 13 is a mask house 1350 that receives a verified layout generated from the IHS 1300 by, for example, a communication network such as LAN/WAN 1316. The mask house 1350 has a mask fabrication tool 1352 (e.g., a mask writer) for fabricating one or more photomasks (e.g., photomask used in the fabrication step as illustrated in FIGS. 8A-8C) based on the verified layout generated from the IHS 1300. An IC fabricator ("Fab") 1360 may be connected to the mask house 1350 and the IHS 1300 by a communication network such as LAN/WAN 1316. Fab 1360 includes an IC fabrication tool 1362 for fabricating IC chips using the photomasks fabricated by the mask house 1350. By way of example and not limitation, the IC fabrication tool 1362 may be a cluster tool for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

In some embodiments, two or more of the IHS 1300, the mask house 1350 and the FAB 1360 are owned by a single company. For example, two or more of the IHS, the mask house 1350 and the FAB 1360 coexist in a common facility and use common resources. In some other embodiments, the IHS 1300 is owned by a design house, which is a different entity than the mask house 1350 and the FAB 1360. In such embodiments, each of the mask house 1350, the FAB 1360 and the design house owning the IHS 1300 interacts with one or more of the other entities and provides services to and/or receives services from one or more of the other entities.

Figure 14:
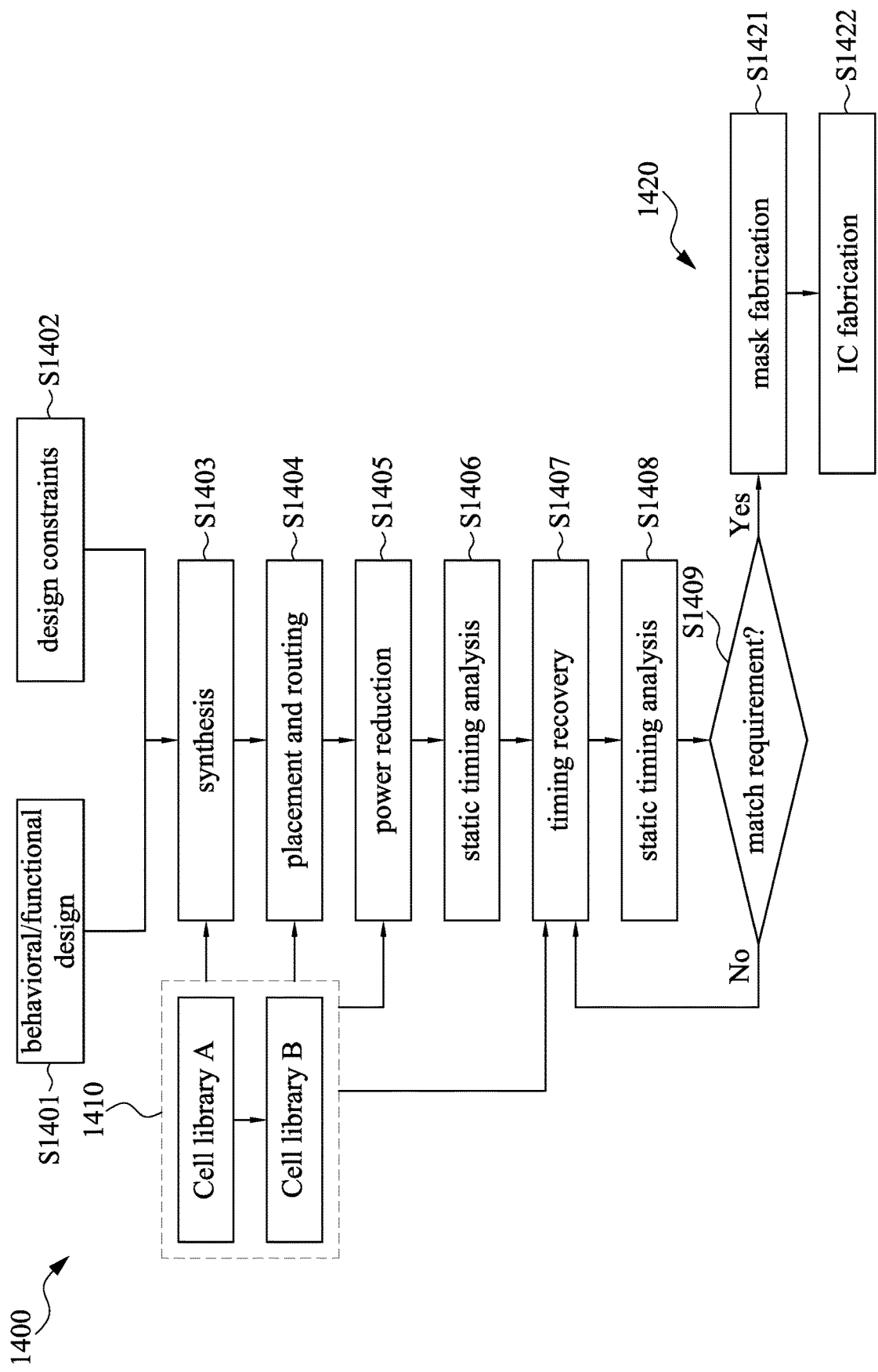
FIG. 14 illustrates a flow chart including an IC design flow and an IC manufacturing flow in accordance with some embodiments of the present disclosure.

FIG. 14 illustrates a flow chart including an IC design flow 1400 and an IC manufacturing flow 1420 in accordance with some embodiments of the present disclosure. The IC design flow 1400 implements an IC design from a high-level specification to a physical layout which is verified for, for example, functionality, speed performance, power, and is tapped out for production of masks. The IC manufacturing flow 1420 manufactures IC chips using photomasks fabricated based on the layout generated from the IC design flow 1400. The IC design flow 1400 can be performed by, e.g., the IHS 1300 with EDA function (as illustrated in FIG. 13) to generate a physical layout of an integrated circuit that includes mixed row fin numbers, in accordance with some embodiments of the present disclosure. In various embodiments, the operations of the IC design flow 1400 are performed by the respective components illustrated in FIG. 13. For purposes of discussion, the following embodiment of the IC design flow 1400 will be described in conjunction with FIG. 13. The illustrated embodiment of the IC design flow 1400 is merely an example. Therefore, it is understood that any of a variety of operations may be omitted, re-sequenced, and/or added while remaining within the scope of the present disclosure.

The IC design flow 1400 starts with provision operations of "behavioral/functional design S1401" and "design constraints S1402." In some embodiments, the behavioral/functional design S1401 specifies the desired behavior or function of an integrated circuit (e.g., the integrated circuits 100, 1100, and/or 1200 as discussed above) based upon various signals or stimuli applied to the inputs of an overall design of the integrated circuit, and may be written in a suitable language, such as a hardware description language (HDL). The behavioral/functional design S1401 may be uploaded into the processing unit 1310 through the I/O interface 1328 (as shown in FIG. 13), such as by a user creating the file while the EDA is executing. Alternatively, the behavioral/functional design S1401 may be uploaded and/or saved on the memory 1322 or mass storage device 1324, or the behavioral/functional design S1401 may be uploaded through the network interface 1340 from a remote user (as shown in FIG. 13). In these instances, the CPU 1320 will access the behavioral/functional design S1401 during execution of the EDA.

Further, the user also provides the design constraints S1402 in order to constrain the overall design of a physical layout of the behavioral/functional design S1402. In some embodiments, the design constraints S1402 may be input, for example, through the I/O interface 1328, downloading through the network interface 1340, or the like. The design constraints S1402 may specify timing, process parameters, and other suitable constraints with which the behavioral/functional design S1401, once physically formed into an integrated circuit, is desired to comply.

After the behavioral/functional design S1401 and the design constraints S1402 are provided, the IC design flow 1400 continues to operation "synthesis S1403" to create a functionally equivalent logic gate-level circuit description, such as a netlist. The synthesis S1403 forms the functionally equivalent logic gate-level circuit description by matching the behavior and/or functions desired from the behavioral/functional design S1401 to (standard) cells from a set of cell libraries S1410, while simultaneously meeting the constraints specified by the design constraints S1402.

In some embodiments, the set of cell libraries S1410 may include a plurality of cell libraries that have cells with different fin numbers such as, for example, cell library A, cell library B, etc. In some embodiments, the cell libraries A and B may correspond to the above-described odd-row cell library and even-row cell library, respectively. Each of the plurality of cell libraries contains a listing of pre-designed cells, each of which is with a common PFET fin number and may perform a specific logic function on a small scale. For example, the cells of the cell library A may share the first PFET fin number, and the cells of the cell library B may share the second PFET fin number different from the first PFET fin number. The cell is stored in the cell libraries (e.g., the cell library A, the cell library B, etc.) as information comprising internal circuit elements, the various connections to these circuit elements, a pre-designed physical layout pattern that includes the PFET fin number, NFET fin number, cell height, dopant types, doping concentrations, wells, and the like. Additionally, the stored cell may also comprise a shape of the cell, terminal positions for external connections, delay characteristics, power consumption, and the like.

Once the synthesis S1403 generates the functionally equivalent logic gate-level circuit description from the behavioral/functional design S1401 and the design constraints S1402 by using the cells of the set of cell libraries S1410 (e.g., the cell library A, the cell library B, etc.), the IC design flow 1400 continues to operation "placement and routing S1404."

The placement and routing S1404 is performed to generate an actual physical design for the overall structure. The place and route S1404 forms the physical design by taking the chosen cells from the set of cell libraries S1410 and placing them into respective rows. This placement and routing S1404 may be done either automatically by an auto placement and routing (APR) tool, or else may alternatively be performed partly through a manual process, whereby a user may manually insert one or more cells into a row. Detailed structure and associated geometry for the devices (e.g., transistors) of the integrated circuit are determined in the placement operation. Interconnects among different devices are routed subsequent to the placement operation. Both placement and routing operations are performed to meet a design rule check (DRC) deck so that the manufacturing requirements of the integrated circuit are fulfilled. In some embodiments, a clock tree synthesis operation is performed at the placement and routing stage S1404 for a digital circuit in which clock generators and circuits are incorporated into the design. Once the placement and routing stage S1404 is complete, an initial placed-and-routed layout having the actual physical design for the overall structure is created, and then IC design flow 1400 continues to operation "power reduction S1405."

In the power reduction stage S1405, some or all of the cells in the initial placed-and-routed layout are swapped or replaced with cells having fewer fins, which in turn can reduce the power of the actual physical design for the overall structure. This power reduction stage S1405 may be done either automatically by, e.g., the APR tool, or else may alternatively be performed partly through a manual process, whereby a user may manually swap cells in the initial placed-and-routed layout with cells having fewer fins. Once the power reduction stage S1405 is complete, a first modified layout having an actual physical design for the overall structure is created, and then IC design flow 1400 continues to operation "static timing analysis S1406."

By way of example and not limitation, the static timing analysis (STA) stage S1406 is performed based on a resistance and capacitance (RC) extraction result about the first modified layout generated from the power reduction stage S1405. The RC extraction is performed by an RC extraction tool to determine parasitic parameters, e.g., parasitic resistance and parasitic capacitance of the cells in the first modified layout. Such parasitic parameters are not intended by the circuit designer, but nevertheless occur as a result of configurations and/or materials of various cells in the integrated circuit. The STA is performed using the extracted parasitic resistances and capacitances to evaluate time delays along various signal paths in the first modified layout. As a result, timing critical paths and non-timing critical paths in the first modified layout can be identified at the STA stage S1406. In some embodiments, the timing critical path is a signal path between an input and an output with the maximum time delay or unacceptable time delay determined based on the RC extraction result, and the non-timing critical path is the signal path between an input and an output with negligible or acceptable time delay determined based on the RC extraction result.

Once the timing-critical paths are identified at the STA stage S1406, the IC design flow 1400 then continues to operation "timing recovery S1407." In the timing recovery stage S1407, some or all of the cells in the identified timing-critical paths are swapped with cells having more fins, which in turn can increase the cells' operation speed and hence reduce the time delay in the identified timing-critical paths. This timing recovery stage S1407 may be done either automatically by, e.g., the APR tool, or else may alternatively be performed partly through a manual process, whereby a user may manually swap cells in the identified timing-critical paths with cells having more fins. Once the timing recovery stage S1407 is complete, a second modified layout having an actual physical design for the overall structure is created, and then IC design flow 1400 continues to another static timing analysis S1408.

By way of example and not limitation, the STA stage S1408 is performed based on an RC extraction result about the second modified layout generated from the timing recovery stage S1407. The RC extraction is performed by the RC extraction tool to determine parasitic parameters, e.g., parasitic resistance and parasitic capacitance of the cells in the second modified layout. The STA stage S1408 is performed using the extracted parasitic resistances and capacitances to evaluate time delays along various signal paths in the second modified layout.

The method then continues to a determination operation S1409 to check whether design requirements are matched. In some embodiments, in the determination operation S1409, various requirements may be checked such as, for example, time delays in the second modified layout, power of the second modified layout and space utilization of the second modified layout (i.e., area of the substrate occupied by the cells), etc., by performing one or more simulations using circuit simulators, e.g., Simulation Program with Integrated Circuit Emphasis (SPICE). If all the design requirements in the determination operation S1409 are met, the second modified layer is accepted as a verified layout and then signed off accordingly. However, if one of the design requirements is not met, the IC design flow 1400 loops back to previous stages for tuning the second modified layout. For example, if the time delays in the second modified layout are unfavorable, the IC design flow 1400 may loop back to the timing recovery stage S1407 where the cells in the timing critical paths are re-swapped to fix time delay issues.

Once the IC design flow 1400 is complete, the verified layout is tapped out, and then the IC manufacturing flow 1420 begins at mask fabrication stage S1421 to fabricate one or more photomasks based on the verified layout accepted in the IC design flow 1400. For example, the mask house 1350 (as shown in FIG. 13) uses the verified layout that is accepted at the determination stage S1409 of the IC design flow 1400 to manufacture one or more photomasks (e.g., the photomask used in the fabricating step as illustrated in FIGS. 8A-8C) to be used for fabricating fins and gate structures of IC chips according to verified layout.

In the mask fabrication stage S1421, the mask house 1350 performs mask data preparation, where verified layout is translated into a representative data file ("RDF"). Mask data preparation provides the RDF to the mask fabrication tool 1352 in the mask house. Mask fabrication tool 1352 includes, for example, a mask writer. The mask writer 1342 converts the RDF to an image on a substrate, such as a photomask (reticle). The verified layout is manipulated by mask data preparation to comply with particular characteristics of the mask writer and/or requirements of Fab 1360.

In some embodiments, mask data preparation includes optical proximity correction (OPC) which uses lithography enhancement techniques to compensate for image errors, such as those that can arise from diffraction, interference, other process effects and the like. OPC adjusts verified layout accepted in the IC design flow 1400. In some embodiments, mask data preparation includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation includes a mask rule checker (MRC) that checks verified layout generated from the IC design flow 1400 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the verified layout diagram to compensate for limitations during mask fabrication, which may undo part of the modifications performed by OPC in order to meet mask creation rules.

In some embodiments, mask data preparation includes lithography process checking (LPC) that simulates processing that will be implemented by the Fab 1360 to fabricate IC chips. LPC simulates this processing based on verified layout generated from the IC design flow 1400 to create a simulated manufactured IC chip. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated IC chip is not close enough in shape to satisfy design rules, OPC and/or MRC are be repeated to further refine verified layout generated from the IC design flow 1400.

One of ordinary skill would understand that the above description of mask data preparation has been simplified for the purposes of clarity. In some embodiments, data preparation includes additional features such as a logic operation (LOP) to modify the verified layout generated from the IC design flow 1400 according to manufacturing rules. Additionally, the processes applied to verified layout generated from the IC design flow 1400 during data preparation may be executed in a variety of different orders.

A photomask or a group of photomasks are fabricated using the mask fabrication tool 1352 based on the verified layout generated from the IC design flow 1400. In some embodiments, the mask fabrication tool 1352 performs one or more lithographic exposures based on the verified layout generated from the IC design flow 1400. In some embodiments, an electron-beam (e-beam) or a mechanism of multiple e-beams is used to form a pattern on a photomask based on verified layout generated from the IC design flow 1400. The photomask(s) can be formed in various technologies. In some embodiments, the photomask(s) is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask(s) includes a transparent substrate (e.g., fused quartz) and an opaque material (e.g., chromium) coated in the opaque regions of the binary mask. In another example, the photomask(s) is formed using a phase shift technology. In a phase shift mask (PSM) version of photomask(s), various features in the pattern formed on the phase shift photomask are configured to have proper phase difference to enhance the resolution and imaging quality. In various examples, the phase shift photomask can be attenuated PSM or alternating PSM. The photomask(s) fabricated by mask fabrication tool 1352 is used in a variety of processes. For example, such a photomask(s) is used in the subsequent IC fabrication stage S1422 that includes, e.g., an ion implantation process to form various doped regions in a semiconductor wafer, in an etching process to form various etching regions in the semiconductor wafer and/or in other suitable processes.

Once mask fabrication stage S1421 is complete, the IC manufacturing flow 1420 continues to the IC fabrication stage S1422 where IC chips are fabricated using, e.g., Fab 1360 (as illustrated in FIG. 13). Fab 1360 uses IC fabrication tool 1362 to fabricate IC chips based on photomask(s) fabricated by mask house 1350 (as shown in FIG. 13). Thus, Fab 1360 at least indirectly uses the verified layout generated from the IC design flow 1400 to fabricate IC chips. In some embodiments, a semiconductor wafer (e.g., Si wafer) undergoes various processes (e.g., process steps of the method 500 as illustrated in FIG. 5) in FAB 1360 using photomask(s) to form IC chips. In some embodiments, the IC fabrication S1422 includes performing one or more photolithographic exposures based at least indirectly on verified layout generated from the IC design flow 1400.

Figure 15:
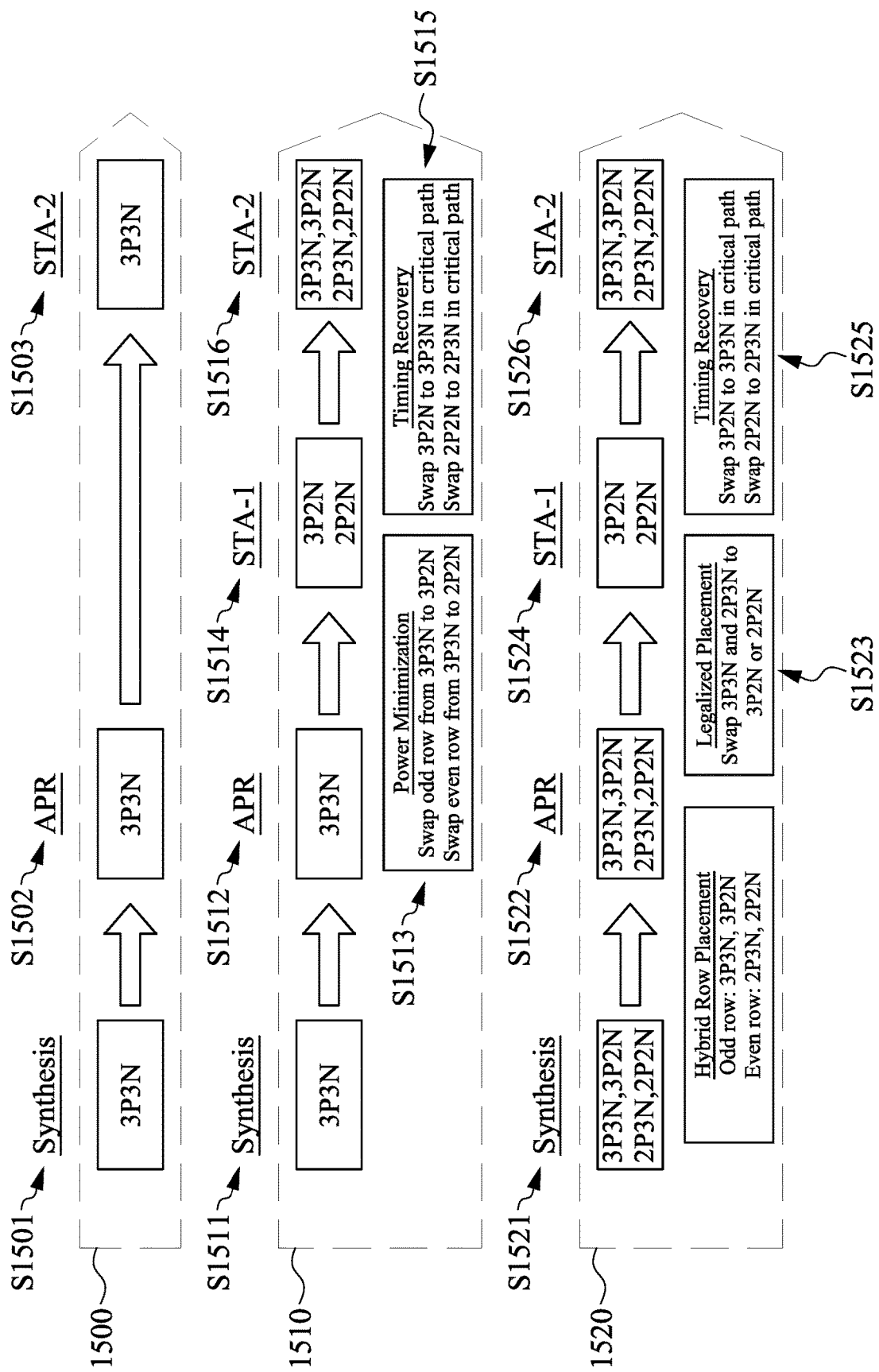
FIG. 15 illustrates a flow chart including a reference IC design flow, a first improved IC design flow and a second improved IC design flow in accordance with some embodiments of the present disclosure.

FIG. 15 illustrates a flow chart including a reference IC design flow 1500, a first improved IC design flow 1510 and a second improved IC design flow 1520 in accordance with some embodiments of the present disclosure. In the reference IC design flow 1500, a synthesis stage S1501 forms a functionally equivalent logic gate-level circuit description by matching the behavior and/or functions desired from behavioral/functional design to 3P3N cells from the cell library A and/or the cell library B, while simultaneously meeting the constraints specified by the design constraints.

Once the synthesis stage S1501 is complete, the reference IC design flow 1500 continues to APR stage S1502 to generate an actual physical design for the overall structure. The APR stage S1502 forms the physical design by taking the chosen 3P3N cells and placing these 3P3N cells into respective rows.

Once the APR stage S1502 is complete, the reference IC design flow 1500 then continues to STA stage S1503 where time delays along various signal paths in the placed-and-routed layout generated from the APR stage S1502 are evaluated. As can be seen from the reference IC design flow 1500, the cells in the synthesis stages S1501, APR stage S1502 and the STA stage S1503 are all 3P3N cells.

In the first improved IC design flow 1510, a synthesis stage S1511 forms a functionally equivalent logic gate-level circuit description by matching the behavior and/or functions desired from behavioral/functional design to 3P3N cells from the cell library A and/or the cell library B, while simultaneously meeting the constraints specified by the design constraints.

Once the synthesis stage S1511 is complete, the first improved IC design flow 1510 continues to APR stage S1512 to generate an actual physical design for the overall structure. The APR stage S1512 forms the physical design by taking the chosen 3P3N cells and placing these 3P3N cells into respective rows.

Once the APR stage S1512 is complete, the first improved IC design flow 1510 then continues to power minimization stage S1513 for power reduction. By way of example and not limitations, in the power minimization stage S1513, the 3P3N cells in odd rows of the placed-and-routed layout generated from the APR stage S1512 are all swapped with 3N2N cells selected from the cell library A (i.e., odd-row cell library), and the 3P3N cells in even rows of the placed-and-routed layout are all swapped with 2P2N cells selected from the cell library A (i.e., odd-row cell library). The power minimization stage S1512 can be done by, e.g., the APR tool.

Once the power minimization stage S1513 is complete, a first modified layout with 3P2N cells in odd rows and 2P2N cells in even rows is created, and the first improved IC design flow 1510 then continues to the first STA stage S1514 where timing critical paths and non-timing critical paths in the first modified layout are identified based on RC extraction result about the first modified layout, as discussed previously with respect to the STA stage S1406 as illustrated in FIG. 14.

Once the first STA stage S1514 is complete, the first improved IC design flow 1510 continues to timing recovery stage S1515. The timing recovery stage S1515 is similar to the timing recovery stage S1407 of the IC design flow 1400 as illustrated in FIG. 14. By way of example and not limitation, in the timing recovery stage S1515, the 3P2N odd-row cells in the timing critical paths identified in the first STA stage S1514 are swapped with 3P3N cells selected from the cell library A (i.e., odd-row cell library), and the 2P2N even-row cells in the timing critical paths identified in the first STA stage S1514 are swapped with 2P3N cells selected from the cell library B (i.e., even-row cell library).

Once the timing recovery stage S1515 is complete, a second modified layout is created and includes 3P3N odd-row cells and 2P3N even-row cells in timing critical paths and 3P2N odd-row cells and 2P2N even-row cells in non-timing critical paths. The first improved IC design flow 1510 then continues to the second STA stage S1516 where time delays along various signal paths in the second modified layout generated from the timing recovery stage S1515 are evaluated. As can be seen from the first improved IC design flow 1510, the cells in the synthesis stages S1511 and APR stage S1512 are all 3P3N cells, the cells in the first STA stage S1514 are 3P2N cells in odd rows and 2P2N cells in even rows, and the cells in the second STA stage S1516 are 3P3N cells, 3P2N cells in odd rows and 2P3N cells, 2P2N cells in even rows.

In the second improved IC design flow 1520, a synthesis stage S1521 forms a functionally equivalent logic gate-level circuit description by matching the behavior and/or functions desired from behavioral/functional design to 3P3N cells, 3P2N cells, 2P3N cells and 2P2N cells from the cell library A and/or the cell library B, while simultaneously meeting the constraints specified by the design constraints.

Once the synthesis stage S1521 is complete, the second improved IC design flow 1520 continues to APR stage S1522 to generate an actual physical design for the overall structure. The APR stage S1522 forms the physical design by placing the chosen 3P3N cells and 3P2N cells into odd rows, and placing the chosen 2P3N cells and 2P2N cells into even rows.

Once the APR stage S1522 is complete, the second improved IC design flow 1520 then continues to legalized placement stage S1523 for power reduction. The legalized placement stage S1523 swaps all cells with three NFET fins in the placed-and-routed layout generated from the APR stage S1522 to cells with two NFET fins. By way of example and not limitation, in the legalized placement stage S1523, the 3P3N cells and the 2P3N cells in the placed-and-routed layout generated from the APR stage S1522 are swapped with 3P2N cells or 2P2N cells selected from the cell library A and/or the cell library B. The legalized placement stage S1523 can be done by, e.g., the APR tool.

Once the legalized placement stage S1523 is complete, a first modified layout with 3P2N cells and 2P2N cells is created, and the second improved IC design flow 1520 then continues to the first STA stage S1524 where timing critical paths and non-timing critical paths in the first modified layout are identified based on RC extraction result about the first modified layout, as discussed previously with respect to the STA stage S1406 as illustrated in FIG. 14.

Once the first STA stage S1524 is complete, the second improved IC design flow 1520 continues to timing recovery stage S1525. By way of example and not limitation, in the timing recovery stage S1525, the 3P2N cells in the timing critical paths identified in the first STA stage S1524 are swapped with 3P3N cells selected from the cell library A and/or the cell library B, and the 2P2N cells in the timing critical paths identified in the first STA stage S1524 are swapped with 2P3N cells selected from the cell library A and/or the cell library B.

Once the timing recovery stage S1525 is complete, a second modified layout is created and includes 3P3N cells and 2P3N cells in timing critical paths and 3P2N cells and 2P2N cells in non-timing critical paths. The second improved IC design flow 1520 then continues to the second STA stage S1526 where time delays along various signal paths in the second modified layout generated from the timing recovery stage S1525 are evaluated. As can be seen from the second improved IC design flow 1520, the cells in the synthesis stage S1521 are 3P3N cells, 3P2N cells, 2P3N cells and 2P2N cells, the cells in the APR stage S1522 are 3P3N cells and 3P2N cells in odd rows and 2P3N cells and 2P2N cells in even rows, the cells in the first STA stage S1524 are 3P2N cells and 2P2N cells, and the cells in the second STA stage S1526 are 3P3N cells, 3P2N cells, 2P3N cells and 2P2N cells.

Figure 16:
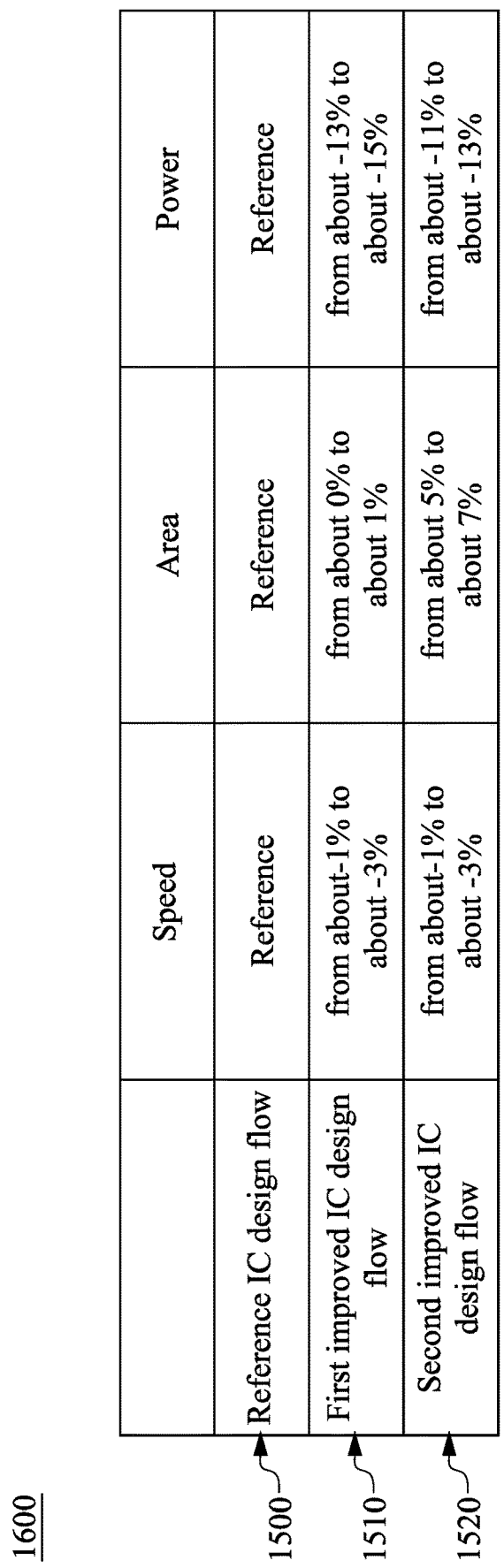
FIG. 16 is a chart providing example simulation results of the layout generated from the reference IC design flow, the layout generated from the first improved IC design flow, and the layout generated from the second improved IC design flow.

FIG. 16 is a chart 1600 providing example simulation results of the layout generated from the reference IC design flow 1500, the layout generated from the first improved IC design flow 1510, and the layout generated from the second improved IC design flow 1520. As compared to the reference IC design flow 1500, the first improved IC design flow 1510 results in a layout with power reduction by about 13% to about 15%, speed degradation by about 1% to about 3%, and area (i.e., space utilization) increase by about 0% to about 1%. Moreover, as compared to the reference IC design flow 1500, the second improved IC design flow 1520 results in a layout with power reduction by about 11% to about 13%, speed degradation by about 1% to about 3%, and area increase by about 5% to about 7%. The simulation results show that the improved IC design flows can trade acceptable or negligible impacts on IC's space utilization and speed performance in exchange for significant IC's power improvement.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the carrier mobility of PFET fins can be sustained because the improved layout design requires no fin cut process performed on the PFET fins. Another advantage is that the power consumption can be significantly reduced.

In some embodiments of the present disclosure, an IC structure includes one or more first cell rows and one or more second cell rows extending in a first direction. Each of the one or more first cell rows includes a plurality of first cells arranged along the first direction. Each of the plurality of first cells includes one or more first fins having first source/drain regions of a first conductivity type and one or more second fins having second source/drain regions of a second conductivity type opposite the first conductivity type. Each of the one or more second cell rows includes a plurality of second cells arranged along the first direction. Each of the plurality of second cells includes one or more third fins having third source/drain regions of the first conductivity type and one or more fourth fins having fourth source/drain regions of the second conductivity type. The plurality of first cells have a same first number of the one or more first fins, and the plurality of second cells have a same second number of the one or more third fins less than the first number of the one or more first fins.

In some embodiments of the present disclosure, an IC structure includes a plurality of first cells and a plurality of second cells. The plurality of first cells each have a first number of one or more P-type field-effect transistor (PFET) fins. A first subset of the plurality of first cells are disposed along a first direction in a first cell row. The plurality of second cells each have a second number of one or more PFET fins different from the first number of one or more PFET fins. A first subset of the plurality of second cells are disposed along the first direction in a second cell row abutting the first cell row. Each of the one of more PFET fins in the first cell row spans an entirety of the first subset of the plurality of first cells, and each of the one or more PFET fins in the second cell row spans an entirety of the first subset of the plurality of second cells.

In some embodiments of the present disclosure, a method includes placing, in a layout, a plurality of first cells each having a first NFET fin number; swapping the plurality of first cells with a plurality of second cells each having a second NFET fin number less than the first NFET fin number; after swapping the plurality of first cells with the plurality of second cells, identifying a timing critical path in the layout; swapping some of the plurality of second cells in the identified timing critical path with a plurality of third cells each having a third NFET fin number greater than the second NFET fin number; and after swapping some of the plurality second cells in the identified timing critical path with the plurality of third cells, fabricating an integrated circuit based on the layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
one or more first cell rows extending in a first direction, each of which comprises a plurality of first cells arranged along the first direction, wherein each of the plurality of first cells comprises one or more first fins having first source/drain regions of a first conductivity type and one or more second fins having second source/drain regions of a second conductivity type opposite the first conductivity type; and
one or more second cell rows extending in the first direction, each of which comprises a plurality of second cells arranged along the first direction, wherein each of the plurality of second cells comprises one or more third fins having third source/drain regions of the first conductivity type and one or more fourth fins having fourth source/drain regions of the second conductivity type,
wherein the plurality of first cells have a same first number of the one or more first fins, and the plurality of second cells have a same second number of the one or more third fins less than the first number of the one or more first fins, wherein the one or more first fins continuously extend across the plurality of first cells along the first direction, and two of the one or more second fins are spaced apart along the first direction.

2. The IC structure of claim 1, wherein the plurality of first cells are different at least in a number of the one or more second fins.

3. The IC structure of claim 1, wherein the plurality of second cells are different at least in a number of the one or more fourth fins.

4. The IC structure of claim 1, wherein the first conductivity type is P-type, and the second conductivity type is N-type.

5. The IC structure of claim 1, wherein the one or more first fins and the one or more third fins are formed of a same first semiconductor material, and the one or more second fins and the one or more fourth fins are formed of a same second semiconductor material different from the first semiconductor material.

6. The IC structure of claim 5, wherein the first semiconductor material is germanium-containing, and the second semiconductor material is germanium-free.

7. The IC structure of claim 1, wherein the one or more first cell rows are alternately arranged with the one or more second cell rows along a second direction perpendicular to the first direction.

8. The IC structure of claim 1, wherein one of the one or more second fins extends across the plurality of first cells along the first direction.

9. The IC structure of claim 1, wherein the one or more third fins continuously extend across the plurality of second cells along the first direction, and two of the one or more fourth fins are spaced apart along the first direction.

10. The IC structure of claim 9, wherein one of the one or more fourth fins extends across the plurality of second cells along the first direction.

11. An IC structure, comprising:
a plurality of first cells each having a first number of one or more P-type field-effect transistor (PFET) fins, wherein a first subset of the plurality of first cells are disposed along a first direction in a first cell row; and
a plurality of second cells each having a second number of one or more PFET fins different from the first number of one or more PFET fins, wherein a first subset of the plurality of second cells are disposed along the first direction in a second cell row abutting the first cell row,
wherein each of the one of more PFET fins in the first cell row spans an entirety of the first subset of the plurality of first cells, and each of the one or more PFET fins in the second cell row spans an entirety of the first subset of the plurality of second cells, wherein one of the one or more NFET fins in the first cell row does not span the entirety of the first subset of the plurality of first cells.

12. The IC structure of claim 11, wherein a first one of the first subset of the plurality of first cells has a first number of one or more N-type field-effect transistor (NFET) fins, and a second one of the first subset of the plurality of first cells has a second number of one or more NFET fins different from the first number of one or more NFET fins.

13. The IC structure of claim 12, wherein a first one of the first subset of the plurality of second cells has a third number of one or more NFET fins, and a second one of the first subset of the plurality of second cells has a fourth number of one or more NFET fins different from the third number of one or more NFET fins.

14. The IC structure of claim 13, wherein the third number of one or more NFET fins of the first one of the first subset of the plurality of second cells is equal to the first number of one or more NFET fins of the first one of the first subset of the plurality of first cells, and the fourth number of one or more NFET fins of the second one of the first subset of the plurality of second cells is equal to the second number of one or more NFET fins of the second one of the first subset of the plurality of first cells.

15. The IC structure of claim 11, wherein a second subset of the plurality of first cells are disposed along the first direction in a third cell row, a second subset of the plurality of second cells are disposed along the first direction in a fourth cell row, and the first, second, third and fourth cell rows are arranged in an alternating configuration along a second direction perpendicular to the first direction.

16. An IC structure, comprising:
  odd rows of cells, each row comprising a first odd-row cell and a second odd-row cell, the first odd-row cell and the second odd-row cell having a same first number of PFET fins and different numbers of NFET fins, wherein the number of NFET fins of the first odd-row cell is greater than the number of NFET fins of the second odd-row cell by one; and
  even rows of cells alternating with the odd rows of cells, each of the even rows of cells comprising a first even-row cell and a second even-row cell, the first even-row cell and the second even-row cell having a same second number of PFET fins and different number of NFET fins, wherein the first number of PFET fins of the first and second odd-row cells is different from the second number of PFET fins of the first and second even-row cells.

17. The IC structure of claim 16, wherein the first and second odd-row cells have a higher operation speed than the first and second even-row cells.

18. The IC structure of claim 16, wherein the first and second even-row cells have lower power consumption than the first and second odd-row cells.

19. The IC structure of claim 16, wherein each row of the odd rows of cells further comprises a third odd-row cell, wherein the first, second, and third odd-row cell are arranged in a first direction, wherein a PFET fin of the first odd-row cell, a PFET fin of the second odd-row cell, and a PFET fin of the third odd-row cell are of a fin structure extending continuously across the first, second, and third odd-row cells along the first fin, and an NFET fin of the third odd-row cell is spaced apart from an NFET fin of the first odd-row cell along the first direction.

20. The IC structure of claim 16, wherein each row of the even rows of cells further comprises a third even-row cell, wherein the first, second, and third even-row cell are arranged in a first direction, wherein a PFET fin of the first even-row cell, a PFET fin of the second even-row cell, and a PFET fin of the third even-row cell are of a fin structure extending continuously across the first, second, and third even-row cells along the first fin, and an NFET fin of the third even-row cell is spaced apart from an NFET fin of the first even-row cell along the first direction.

* * * * *